United States Patent
Yoon et al.

(10) Patent No.: US 10,998,366 B2
(45) Date of Patent: May 4, 2021

(54) IMAGE SENSOR AND IMAGE SENSING APPARTATUS

(71) Applicant: SAMSUNG ELECTRONICS CO., LTD., Suwon-si (KR)

(72) Inventors: Sung Hyun Yoon, Seoul (KR); Doo Won Kwon, Seongnam-si (KR); Kwan Sik Kim, Seoul (KR); Tae Young Song, Hwaseong-si (KR); Min Jun Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/732,561

(22) Filed: Jan. 2, 2020

(65) Prior Publication Data
US 2020/0135791 A1 Apr. 30, 2020

Related U.S. Application Data

(63) Continuation of application No. 16/018,709, filed on Jun. 26, 2018, now Pat. No. 10,566,370.

(30) Foreign Application Priority Data

Oct. 31, 2017 (KR) ........................ 10-2017-0143483

(51) Int. Cl.
*H01L 27/146* (2006.01)
*H01L 27/30* (2006.01)
(Continued)

(52) U.S. Cl.
CPC .... *H01L 27/14634* (2013.01); *H01L 27/1469* (2013.01); *H01L 27/14636* (2013.01);
(Continued)

(58) Field of Classification Search
CPC ......... H01L 27/14621; H01L 27/14627; H01L 27/1463; H01L 27/14634; H01L 27/14636;
(Continued)

(56) References Cited

U.S. PATENT DOCUMENTS 7,282,444 B2 10/2007 Tanida et al.
8,264,067 B2 9/2012 Law et al.
(Continued)

FOREIGN PATENT DOCUMENTS

JP 2005-167093 A 6/2005
JP 2017-55054 A 3/2017
(Continued)

*Primary Examiner* — Allan R Wilson
(74) *Attorney, Agent, or Firm* — Lee IP Law, PC

(57) ABSTRACT

An image sensing apparatus includes a first substrate structure, a second substrate structure, and a memory chip. The first substrate structure includes a pixel region having a photoelectric conversion element. The second substrate structure includes a first surface connected to the first substrate structure and a second surface opposite the first surface, and also includes a circuit region to drive the pixel region. The memory chip is mounted on the second surface of the second substrate structure. The first substrate structure and the second substrate structure are electrically connected by first connection vias passing through the first substrate structure. The second substrate structure and the memory chip are electrically connected by second connection vias passing through a portion of the second substrate structure. The first connection vias and the second connection vias are at different positions on a plane.

20 Claims, 23 Drawing Sheets

(51) Int. Cl.
- *H01L 27/28* (2006.01)
- *H01L 31/024* (2014.01)
- *H01L 51/42* (2006.01)
- *H01L 31/102* (2006.01)

(52) U.S. Cl.
CPC .. *H01L 27/14645* (2013.01); *H01L 27/14665* (2013.01); *H01L 27/14685* (2013.01); *H01L 27/14689* (2013.01); *H01L 27/286* (2013.01); *H01L 27/307* (2013.01); *H01L 31/024* (2013.01); *H01L 31/102* (2013.01); *H01L 51/42* (2013.01); *H01L 27/1463* (2013.01); *H01L 27/1464* (2013.01); *H01L 27/14621* (2013.01); *H01L 27/14627* (2013.01)

(58) Field of Classification Search
CPC ........... H01L 27/1464; H01L 27/14645; H01L 27/14665; H01L 27/14685; H01L 27/14689; H01L 27/1469; H01L 27/286; H01L 27/307; H01L 31/024; H01L 31/102; H01L 51/42

See application file for complete search history.

(56) References Cited

U.S. PATENT DOCUMENTS

| | | |
|---|---|---|
| 8,569,856 B2 | 10/2013 | Qian et al. |
| 8,729,712 B2 | 5/2014 | Qian et al. |
| 9,087,759 B1 | 7/2015 | Yang |
| 9,431,450 B2 | 8/2016 | Umebayashi |
| 9,496,309 B2 | 11/2016 | Yang |
| 9,899,443 B2 | 2/2018 | Lee et al. |
| 2011/0111560 A1 | 5/2011 | Purushothaman et al. |
| 2011/0157445 A1 | 6/2011 | Itonaga et al. |
| 2011/0233702 A1* | 9/2011 | Takahashi ......... H01L 27/14636 257/432 |
| 2012/0199930 A1 | 8/2012 | Hayashi |
| 2014/0094030 A1 | 4/2014 | Shimotsusa |
| 2015/0270307 A1 | 9/2015 | Umebayashi et al. |
| 2016/0255296 A1 | 9/2016 | Iwabuchi et al. |
| 2017/0092680 A1 | 3/2017 | Kwon |
| 2017/0229509 A1 | 8/2017 | Lee et al. |

FOREIGN PATENT DOCUMENTS

| | | |
|---|---|---|
| KR | 10-2011-0130111 A | 12/2011 |
| KR | 10-1137688 B1 | 4/2012 |

* cited by examiner

IMAGE SENSOR AND IMAGE SENSING APPARTATUS

CROSS-REFERENCE TO RELATED APPLICATIONS

This is a continuation application based on pending application Ser. No. 16/018,709, filed Jun. 26, 2018, the entire contents of which is hereby incorporated by reference.

Korean Patent Application No. 10-2017-0143483, filed on Oct. 31, 2017, and entitled, "Image Sensing Apparatus," is incorporated by reference in its entirety.

BACKGROUND

1. Field

One or more embodiments described herein relate to an image sensing apparatus.

2. Description of the Related Art

Image sensing devices capture images and convert them to electrical signals. These devices are used, for example, in automobile cameras, security devices, robots, digital cameras, camera modules for mobile phones, and portable camcorders. In order to meet product specifications, many of these image sensing devices should be compact in size, have high resolution, and perform high-speed image data processing.

SUMMARY

In accordance with one or more embodiments, an image sensing apparatus includes a first substrate structure including a pixel region having a photoelectric conversion element; a second substrate structure including a first surface connected to the first substrate structure and a second surface opposite the first surface, the second substrate structure including a circuit region to drive the pixel region; and a memory chip mounted on the second surface of the second substrate structure, wherein the first substrate structure and the second substrate structure are electrically connected by first connection vias passing through the first substrate structure, the second substrate structure and the memory chip are electrically connected by second connection vias passing through a portion of the second substrate structure, and the first connection vias and the second connection vias are at different positions on a plane.

In accordance with one or more other embodiments, an image sensing apparatus includes a first substrate structure including a pixel region having a photoelectric conversion element; a second substrate structure including a circuit region electrically connected to the pixel region of the first substrate structure to drive the pixel region; and at least one semiconductor chip mounted on the second substrate structure, connected to the second substrate by a conductive bump, and electrically connected to the circuit region by connection vias, the connection vias passing through a portion of the second substrate structure, wherein the second substrate structure includes a pad region around the circuit region and having pads and wherein the connection vias are in the circuit region and the pad region.

In accordance with one or more other embodiments, an image sensing apparatus includes a first substrate structure including a pixel region having a photoelectric conversion element, the first substrate structure including first connection vias; a second substrate structure stacked on one surface of the first substrate structure and electrically connected to the first substrate structure by the first connection vias, the second substrate structure including second connection vias and a circuit region to drive the pixel region; and a semiconductor chip stacked on one surface of the second substrate structure and electrically connected to the second substrate structure by the second connection vias, wherein the first connection vias and the second connection vias are shifted with respect to each other in a direction in which the first substrate structure and the second substrate structure are stacked.

BRIEF DESCRIPTION OF DRAWINGS

Features will become apparent to those of skill in the art by describing in detail exemplary embodiments with reference to the attached drawings in which.

DETAILED DESCRIPTION

Figure 1:
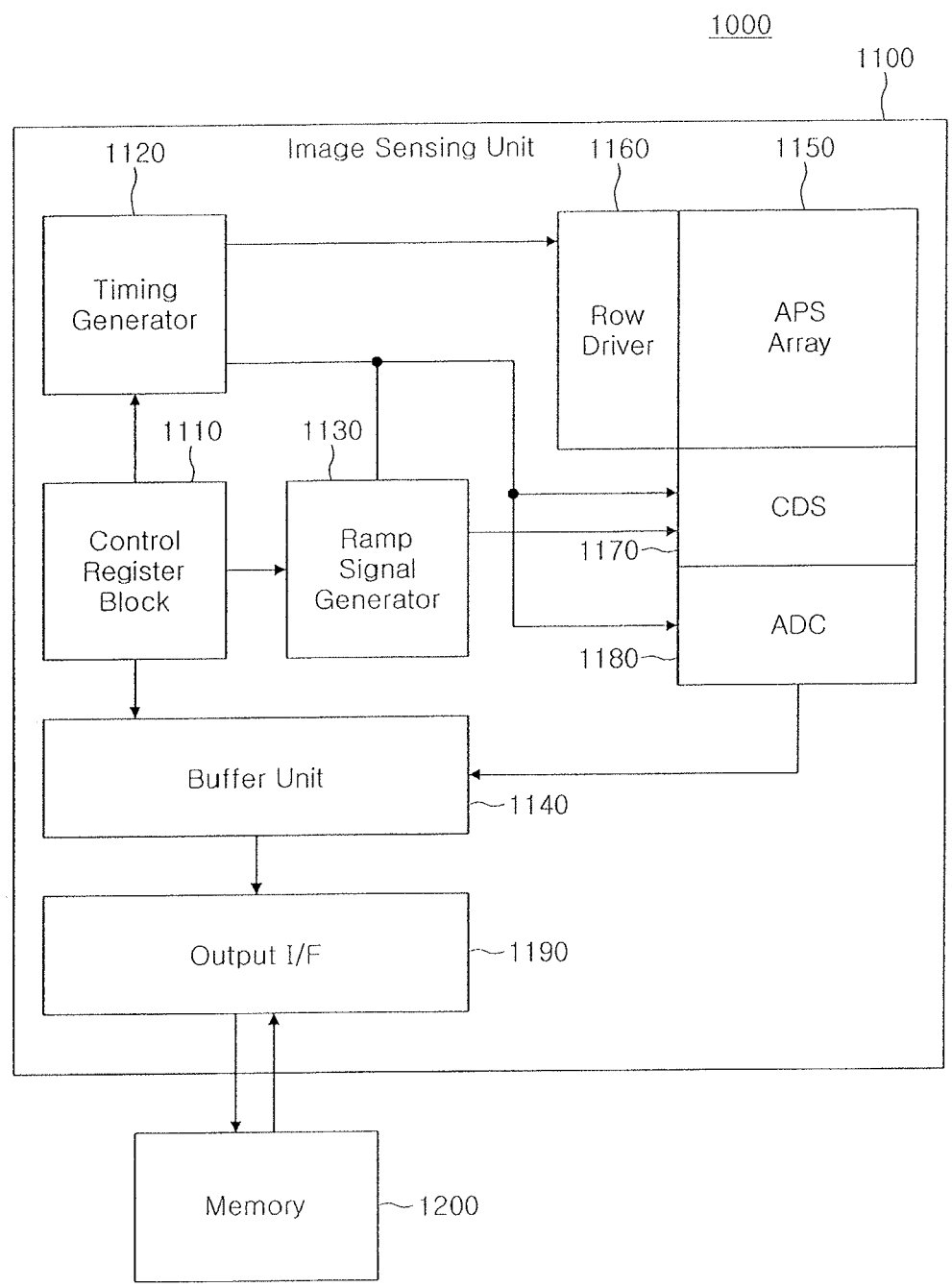
FIG. 1 illustrates an embodiment of an image sensing apparatus.

FIG. 1 illustrates an embodiment of an image sensing apparatus 1000 which may include an image sensing unit 1100 and a memory 1200. The image sensing unit 1100 may include a control register block 1110, a timing generator 1120, a ramp signal generator 1130, a buffer unit 1140, an active pixel sensor (APS) array 1150, a row driver 1160, a correlated double sampler (CDS) 1170, an analog-to-digital converter (ADC) 1180, and an output interface (I/F) 1190.

The control register block 1110 may control overall operations of the image sensing unit 1100. For example, the control register block 1110 may directly transmit operating signals to the timing generator 1120, the ramp signal generator 1130, and the buffer unit 1140. The timing generator 1120 may generate an operating timing reference signal for the various components of the image sensing unit 1100. The operating timing reference signal, generated by the timing generator 1120, may be transmitted to the row driver 1160, the CDS 1170, and/or the ADC 1180. The ramp signal generator 1130 may generate and transmit, for example, a ramp signal used in the CDS 1170. The buffer unit 1140 may include a latch and may temporarily store an image signal to be transmitted to an external device. The output I/F 1190 may transmit image data to the memory 1200 and the external device.

The APS array 1150 may sense an external image. The APS array 1150 includes a plurality of active pixels. The row driver 1160 may selectively activate rows of the APS array 1150. The CDS 1170 may sample and output an analog signal generated by the APS array 1150. The ADC 1180 may convert analog image data to digital image data and output a plurality of digital pixel signals generated based on the conversion results.

The memory 1200 may receive image data from the image sensing unit 1100, store or process the received image data, and retransmit the stored or processed image data to the image sensing unit 1100. The memory 1200 may include a memory device, e.g., a dynamic random access memory (DRAM) device, a static random access memory (SRAM) device, a spin-transfer torque magnetic random-access memory (STT-MRAM) device, or a flash memory device. When the memory 1200 may include a DRAM device, the memory 1200 may receive image data at a relatively high speed and process the received image data.

Figure 2:
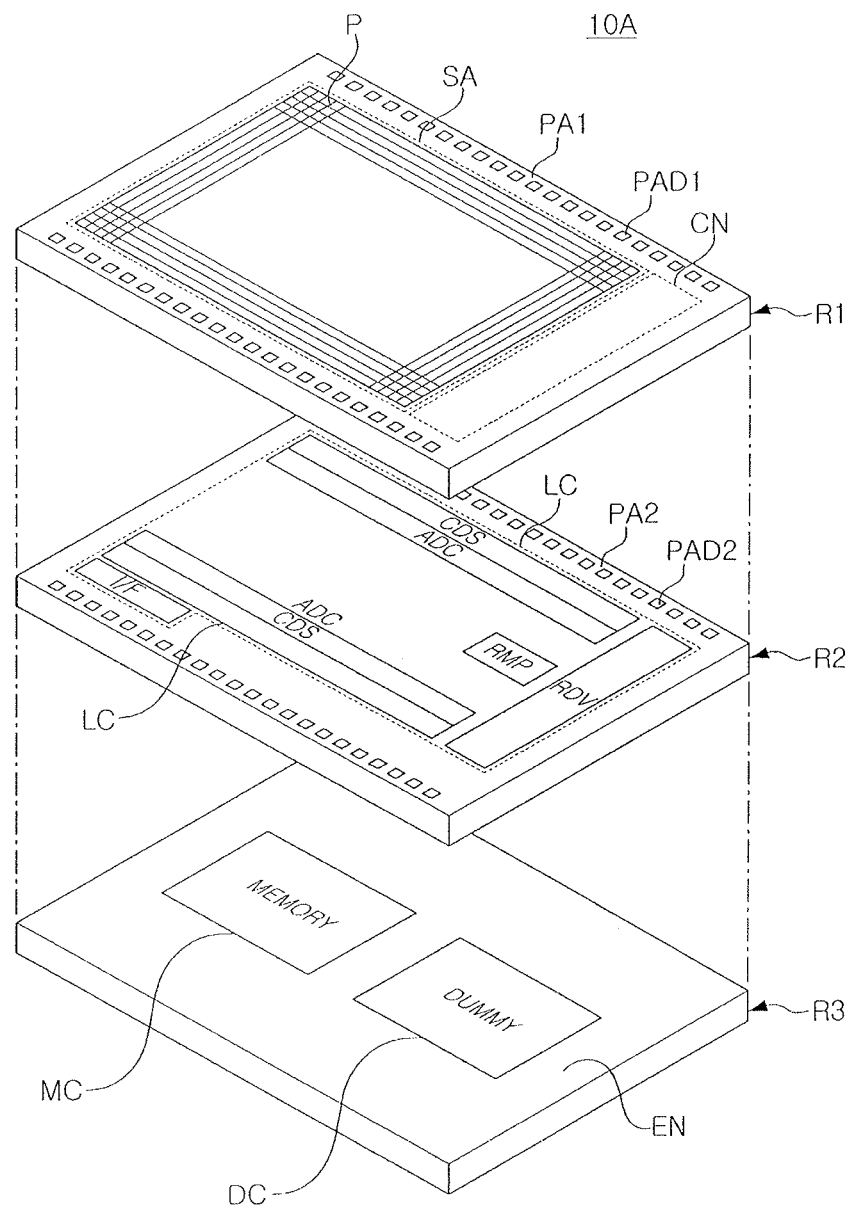
FIG. 2 illustrates a layout embodiment of an image sensing apparatus.

FIG. 2 illustrates a schematic layout embodiment of an image sensing apparatus 10A which may include first to third regions R1 to R3 stacked in a vertical direction. The first and second regions R1 and R2 may correspond to the image sensing unit 1100 of FIG. 1. The third region R3 may correspond to the memory 1200 of FIG. 1.

The first region R1 may include a sensor array region SA, a first pad region PA1, and a connection region CN, and the second region R2 may include a logic circuit region LC and a second pad region PA2. The third region R3 may include a memory chip MC and a dummy chip DC. The first to third regions R1 to R3 may be sequentially stacked in the vertical direction.

In the first region R1, the sensor array region SA may be a region corresponding to the APS array 1150, for example, as described above with reference to FIG. 1. The sensor array region SA may include a plurality of unit pixels P arranged in a matrix. Each unit pixel P may include a photodiode and transistors.

The first pad region PA1 may be around the sensor array region SA and include a plurality of first pads PAD1. The first pads PAD1 may transmit electrical signals to, or to receive electrical signals from, an external or other device.

The connection region CN may be a region in which first connection vias connect the first region R1 to the second region R2. In the second region R2, the logic circuit region LC may include electronic devices including a plurality of transistors. The logic circuit region LC may be electrically connected to the sensor array region SA to provide a predetermined signal to each unit pixel P of the sensor array region SA or to control a signal output therefrom.

The logic circuit region LC may include regions corresponding to the control register block 1110, the timing generator 1120, the ramp signal generator 1130, the buffer unit 1140, the row driver 1160, the CDS 1170, the ADC 1180, and the output I/F 1190 described above with reference to FIG. 1. For example, the logic circuit region LC may include the regions (except for the APS array 1150) in the image sensing unit 1100 of FIG. 1. FIG. 2 illustrates a ramp region RMP corresponding to the ramp signal generator 1130, a driver region RDV corresponding to the row driver 1160, a sampler region CDS corresponding to the CDS 1170, a conversion region ADC corresponding to the ADC 1180, and an interface region I/F corresponding to the output I/F 1190. An arrangement of the respective regions corresponding to the logic circuit region LC is provided as an example. The regions may be arranged differently in other embodiments.

The second pad region PA2 may be around the logic circuit region LC and include a plurality of second pads PAD2. The second pad region PA2 may be in a region of the second region R2 including a region corresponding to the first pad region PA1 of the first region R1.

In the third region R3, the memory chip MC may be encapsulated, together with the dummy chip DC, by an encapsulation portion EN. Each of the first and second regions R1 and R2 may be a semiconductor wafer-based structure. The third region R3 may be a structure including a semiconductor chip. The memory chip MC may be electrically connected to the logic circuit region LC of the second region R2 to transmit or receive image data. The dummy chip DC may optionally be disposed in a region outside the third region R3 including the memory chip MC and may perform a heat dissipation function.

Figure 3:
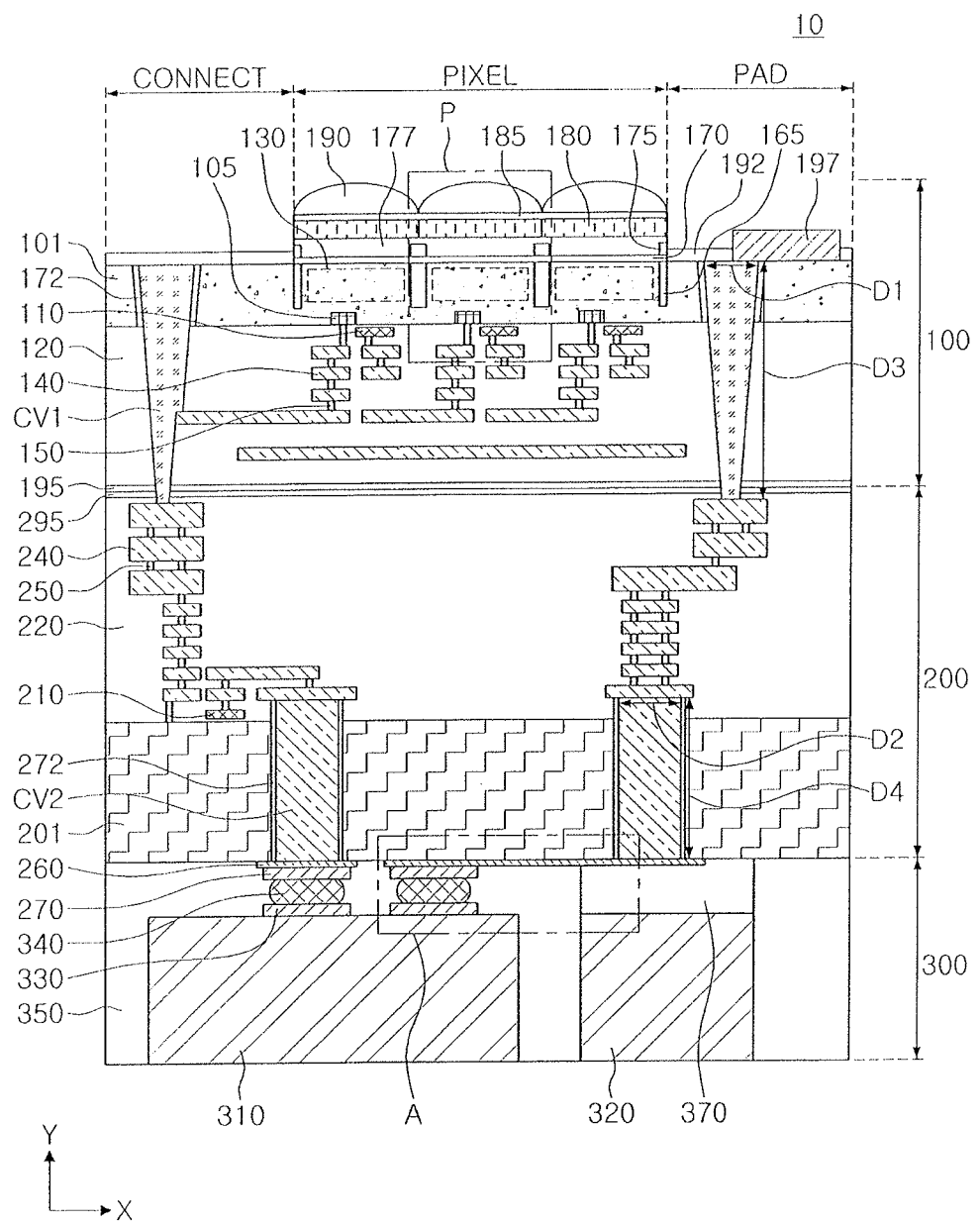
FIG. 3 illustrates a cross-sectional embodiment of an image sensing apparatus.

FIG. 3 illustrates a cross-sectional embodiment of an image sensing apparatus 10. The terms "upper," "upper portion," "upper surface," "lower," "lower portion," "lower surface," and "side surface" may be understood below on the basis of directions depicted in the drawings, except when otherwise indicated as noted herein.

Referring to FIG. 3, the image sensing apparatus 10 may include a first substrate structure 100, a second substrate structure 200, and a chip structure 300 stacked in one direction, for example, a y direction. The first substrate structure 100 may include pixels. The second substrate structure 200 may include a circuit driving the pixels. The chip structure 300 may include a memory chip connected to the circuit. The first substrate structure 100, the second substrate structure 200, and the chip structure 300 may correspond to the first region R1, the second region R2, and the third region R3, respectively, as described with reference to FIG. 2.

The first substrate structure 100 may include a pixel region PIXEL having pixels P arranged in a matrix, a pad region PAD having a pad layer 197 disposed therein to transmit electrical signals to, or to receive electrical signals from, an external or other device, and a connection region CONNECT electrically connecting the pixel region PIXEL of the first substrate structure 100 to the second substrate structure 200 disposed below the first substrate structure 100. The pixel region PIXEL, the pad region PAD, and the connection region CONNECT may correspond to the sensor array region SA, the first pad region PA1, and the connection region CN of FIG. 2, respectively. (Only a portion of each of the pixel region PIXEL, the pad region PAD, and the connection region CONNECT is illustrated for purpose of description).

The first substrate structure 100 may include a first substrate 101, a first interlayer insulating layer 120, and a first bonding layer 195. The first substrate 101 may be a semiconductor substrate. For example, the first substrate 101 may be a p-type silicon substrate. In example embodiments, the first substrate 101 may include a p-type bulk substrate and a p- or n-type epitaxial layer grown thereon. In one embodiment, the first substrate 101 may include an n-type bulk substrate and a p- or n-type epitaxial layer grown thereon. In example embodiments, the first substrate 101 may also be an organic plastic substrate.

The first interlayer insulating layer 120 may include an insulating material and may include one or more layers. For example, the first interlayer insulating layer 120 may include a silicon oxide and/or a silicon nitride.

The first bonding layer 195 may bond the first substrate structure 100 to the second substrate structure 200. The first bonding layer 195 may include an insulating material, e.g., at least one of SiO, SiN, SiCN, SiOC, SiON, or SiOCN.

The pixel region PIXEL may include storage node regions 105 and photodiodes 130 within the first substrate 101, pixel gate layers 110, first wiring layers 140, and first vias 150 within the first interlayer insulating layer 120, and color filters 180 and microlenses 190 above the first substrate 101. The pixel region PIXEL may further include pixel isolation regions 165 within the first substrate 101, and a buffer layer 170, grids 175, a lower planarization layer 177, and an upper planarization layer 185 on the first substrate 101.

The pad region PAD and the connection region CONNECT may be around the pixel region PIXEL and may include an upper insulating layer 192 on the first substrate 101, first connection vias CV1 passing through the first substrate 101 and the first interlayer insulating layer 120, and a first via insulating layer 172 on a portion of a side wall of each of the first connection vias CV1. The pad region PAD may further include a pad layer 197 on the first substrate 101, such that the pad layer 197 may be exposed by the upper insulating layer 192.

The upper insulating layer 192 may include an insulating material, for example, a silicon oxide and/or a silicon nitride. The pad layer 197 may include a conductive material, e.g., at least one of tungsten (W), copper (Cu), aluminum (Al), gold (Au), silver (Ag), or any alloy thereof.

The first connection via CV1 may electrically connect the first substrate structure 100 to the second substrate structure 200. The first connection via CV1 may pass through the entirety of the first substrate 101 and the first interlayer insulating layer 120, and may extend to a portion of a second interlayer insulating layer 220 of the second substrate structure 200. The first connection via CV1 may be connected to second wiring layers 240 within the second interlayer insulating layer 220 on a lower portion of the first connection via CV1. The first connection via CV1 may be connected to the first wiring layers 140 within the first interlayer insulating layer 120.

In the pad region PAD, the first connection via CV1 may be connected to the pad layer 197 on an upper portion thereof. The first connection via CV1 may have a cylindrical shape, may have a width narrowing from the upper portion thereof to the lower portion thereof. In one embodiment, the first connection via CV1 may include a conductive material, e.g., at least one of tungsten (W), copper (Cu), aluminum (Al), gold (Au), silver (Ag), or any alloy thereof.

The first connection via CV1 may have a first diameter D1 in a predetermined range, e.g., from 0.3 μm to 4 μm. In the present specification, when an object is not cylindrical or circular, the term "diameter" may be understood as a length of the longest diagonal line of the object on a plane. The first connection via CV1 may have a first height D3 in a predetermined range, e.g., from 8 μm to 15 μm.

The first via insulating layer 172 may be within the first substrate 101 to electrically isolate the first substrate 101 from the first connection via CV1. As illustrated in FIG. 3, the first via insulating layer 172 may be in contact with the first connection via CV1. In example embodiments, the first via insulating layer 172 may also be spaced apart from the first connection via CV1. The first via insulating layer 172 may include an insulating material, for example, a silicon oxide and/or a silicon nitride.

The second substrate structure 200 may include a second substrate 201, the second interlayer insulating layer 220, and a second bonding layer 295. The second substrate structure 200 may further include circuit gate layers 210, the second wiring layers 240, and second vias 250 within the second interlayer insulating layer 220, and second connection vias CV2 and second via insulating layers 272 within the second substrate 201. The second substrate structure 200 may further include redistribution layers 260 and first connection pads 270 on a lower surface of the second substrate 201.

The second substrate 201 may be a semiconductor substrate. For example, the second substrate 201 may include a semiconductor material such as a Group IV semiconductor material. The Group IV semiconductor may include, for example, silicon, germanium, or silicon-germanium. The second substrate 201 may also be provided as a bulk wafer, an epitaxial layer, a silicon on insulator (SOI) layer, a semiconductor on insulator (SOI) layer, or another type of layer.

The second interlayer insulating layer 220 may include an insulating material and may include one or more layers. For example, the second interlayer insulating layer 220 may include a silicon oxide and/or a silicon nitride.

The second bonding layer 295 may be a layer for bonding the first substrate structure 100 to the second substrate structure 200. The second bonding layer 295 may include an insulating material, e.g., at least one of SiO, SiN, SiCN, SiOC, SiON, or SiOCN.

The circuit gate layers 210 may be gate electrode layers of circuit elements. The circuit gate layers 210 may include a doped semiconductor material and/or a metallic material. Each of the second wiring layers 240 and the second vias 250 may include a conductive material, for example, at least one of tungsten (W), copper (Cu), aluminum (Al), gold (Au), silver (Ag), or any alloy thereof. The number of the second wiring layers 240 and the number and an arrangement of the second vias 250 may be different among various embodiments.

The second connection via CV2 may electrically connect the second substrate structure 200 to the chip structure 300. The second connection via CV2 may pass through the entirety of the second substrate 201 and may extend into the second interlayer insulating layer 220. The second connection via CV2 may be connected to the second wiring layers 240 within the second interlayer insulating layer 220 on an upper portion of the second connection via CV2. The second connection via CV2 may be connected to the redistribution layer 260 or the first connection pad 270 on a lower portion thereof. The second connection via CV2 may have a cylindrical or other shape and may have a width narrowing from the upper portion thereof to the lower portion thereof or from the lower portion thereof to the upper portion thereof. The second connection via CV2 may include a conductive material, for example, at least one of tungsten (W), copper (Cu), aluminum (Al), gold (Au), silver (Ag), or any alloy thereof.

The second connection vias CV2 and the first connection vias CV1 may be shifted with respect to each other without overlapping each other in the direction, for example, the y direction, in which the first substrate structure 100 and the second substrate structure 200 are stacked. The second connection vias CV2 and the first connection vias CV1 may be formed of different materials and have different sizes. The second connection vias CV2 may include, for example, copper (Cu). The first connection vias CV1 may include, for example, tungsten (W). The second connection via CV2 may have a second diameter D2, which may be greater than the first diameter D1 of the first connection via CV1. The second diameter D2 may be in a predetermined range, e.g., from 4 μm to 10 μm. The second connection via CV2 may have a second height D4 greater than the first height D3 of the first connection via CV1. The second height D4 may be in a predetermined range, for example, from 50 μm to 80 μm.

The second via insulating layer 272 may be within the second substrate 201 and the second interlayer insulating layer 220 to electrically isolate the second substrate 201 from the second connection via CV2. The second via insulating layer 272 may include an insulating material, for example, a silicon oxide and/or a silicon nitride.

The redistribution layer 260 and the first connection pad 270 may be connection structures for bonding the second substrate structure 200 to the chip structure 300. Each of the redistribution layer 260 and the first connection pad 270 may include one or more layers. Each of the redistribution layer 260 and the first connection pad 270 may include a conductive material, for example, at least one of tungsten (W), copper (Cu), tin (Sn), nickel (Ni), aluminum (Al), gold (Au), silver (Ag), or any alloy thereof. In some example embodiments, the redistribution layer 260 may be omitted. In this case, the second connection via CV2 may be directly connected to the first connection pad 270.

The chip structure 300 may include a memory chip 310, a dummy chip 320, and an encapsulation portion 350, and may further include second connection pads 330, bumps 340, and a bonding layer 370 within the encapsulation portion 350.

The memory chip 310 may include a memory device, e.g., a dynamic random access memory (DRAM) device, a static random access memory (SRAM) device, a spin-transfer torque magnetic random-access memory (STT-MRAM) device, or a flash memory device. The memory chip 310 may have an upper surface (which may be an active surface) bonded to the lower surface of the second substrate 201 in a flip-chip bonding manner. In one embodiment, the dummy chip 320 may be parallel to the memory chip 310 in an x direction, with respect to a side surface of the memory chip 310. When the size of the memory chip 310 is relatively less than that of the second substrate 201, the dummy chip 320 may be within the encapsulation portion 350 to thereby increase heat dissipation properties and mechanical strength of the image sensing apparatus 10. The number and an arrangement of each of the memory chip 310 and the dummy chip 320 may vary among example embodiments. In some example embodiments, the dummy chip 320 may be omitted. In this case, only the memory chip 310 may be disposed.

The encapsulation portion 350 may include a resin material and may include one or more layers. The encapsulation portion 350 may include, for example, an epoxy or silicone resin. The encapsulation portion 350 may encapsulate the second connection pad 330, the bump 340, and the bonding layer 370, and may be disposed such that lower surfaces of the memory chip 310 and the dummy chip 320 may be exposed. In example embodiments, the encapsulation portion 350 may also cover the lower surfaces of the memory chip 310 and the dummy chip 320.

Each of the second connection pad 330 and the bump 340 may include a conductive material. The bump 340 may have a cylindrical shape, a spherical shape, a shape that corresponds to a portion of a spherical shape, or another shape. The bump 340 may include, for example, Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

The bonding layer 370 may bond the dummy chip 320 to the second substrate structure 200. The bonding layer 370 may include, for example, a non-conductive film (NCF) or a non-conductive paste (NCP). In example embodiments, a thickness of the bonding layer 370 may be relatively less than the sum of thicknesses of the second connection pad 330 and the bump 340. In this case, the lower surface of the dummy chip 320 may be covered by the encapsulation portion EN.

In the example embodiment, the chip structure 300 may be in a lowermost portion of the image sensing apparatus 10. In example embodiments, the chip structure 300 may be between the first substrate structure 100 and the second substrate structure 200. In this case, the first connection via CV1 may be connected to the second substrate structure 200 through the encapsulation portion 350.

Figure 4A:
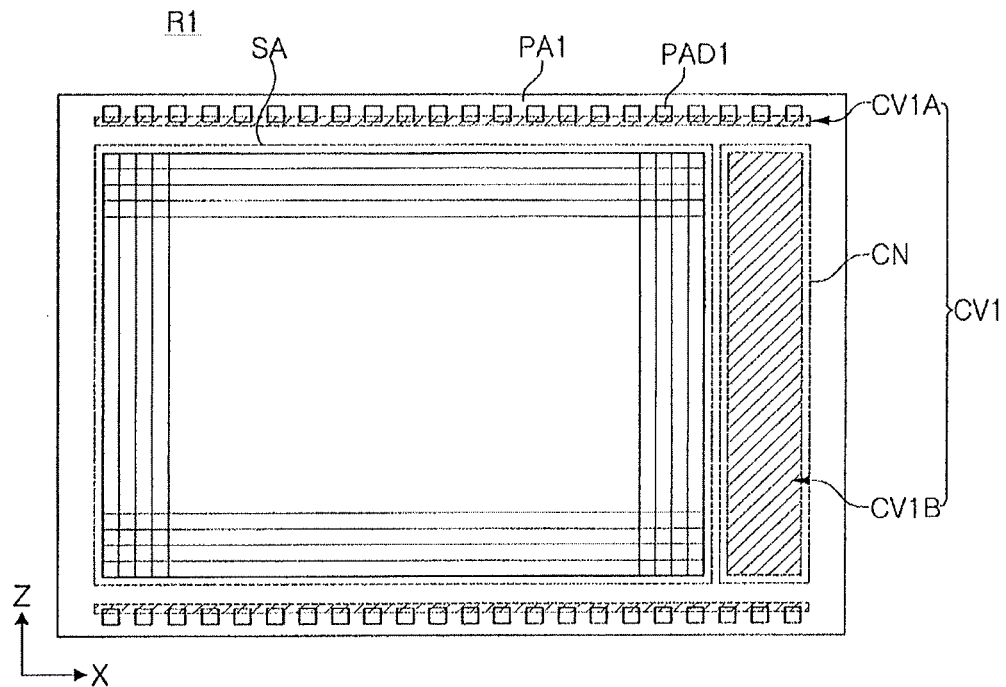
FIGS. 4A, 4B, and 5 illustrate embodiments of first and second connection vias.
Figure 4B:
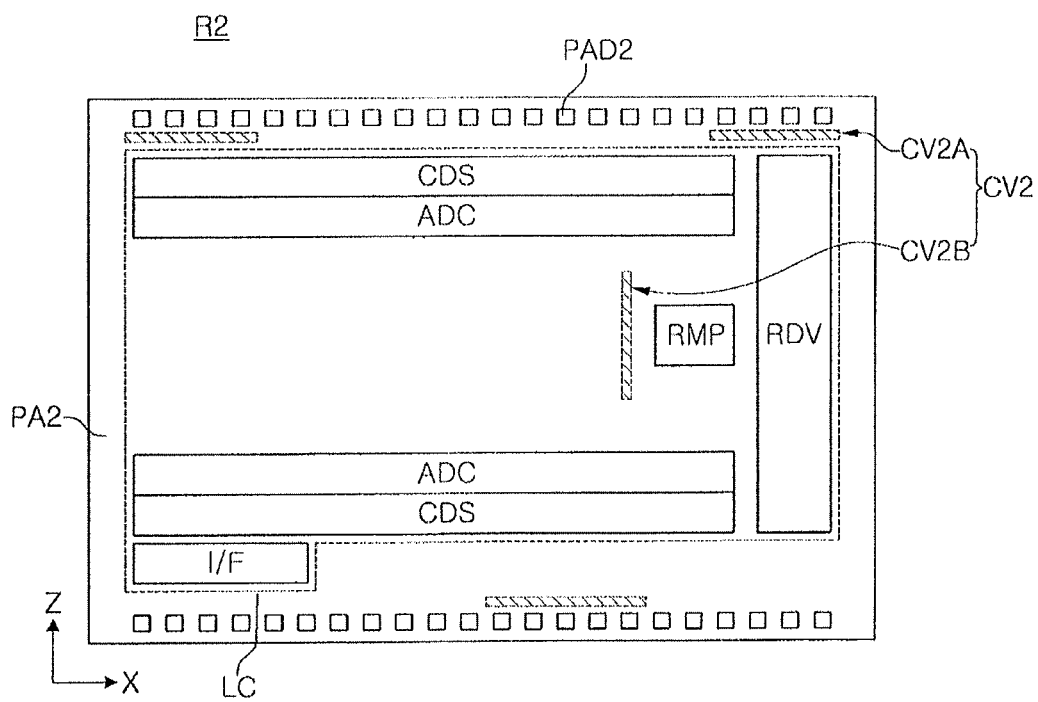
Figure 5:
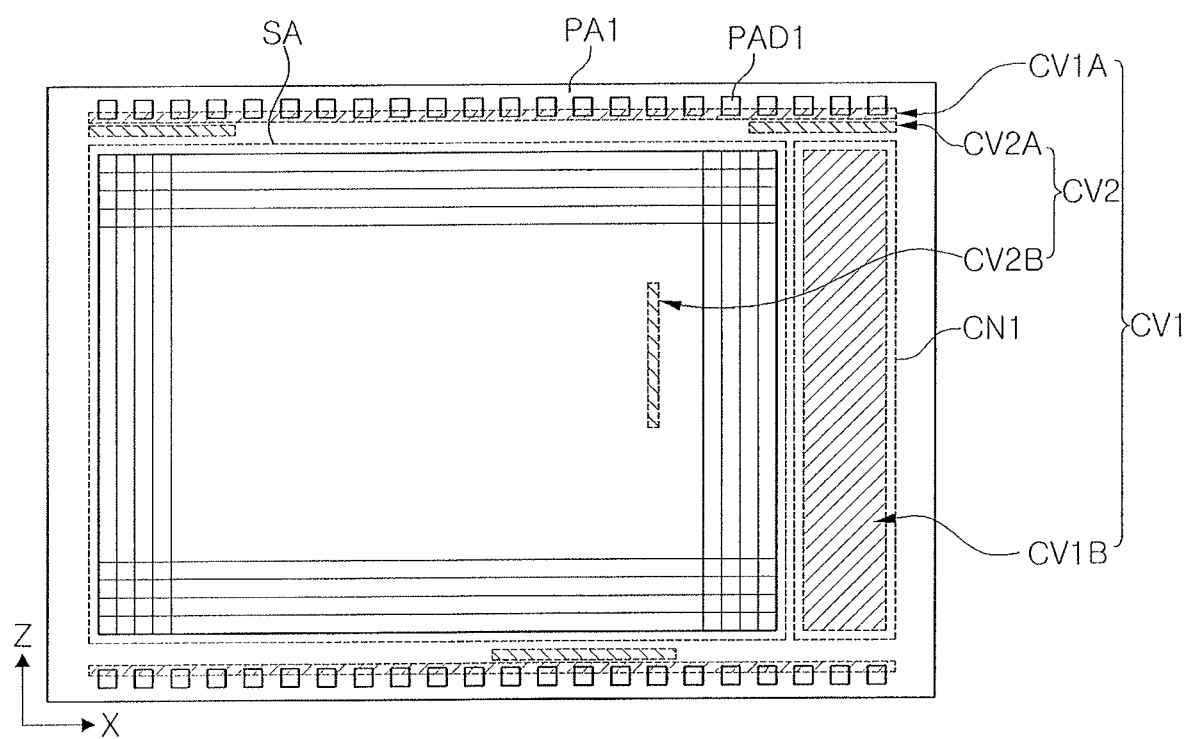

FIGS. 4A, 4B, and 5 illustrate layout embodiments of first and second connection vias in an image sensing apparatus. FIGS. 4A and 4B illustrate schematic dispositions of the first and second connection vias CV1 and CV2 in the first and second regions R1 and R2 of the image sensing apparatus 10A illustrated in FIG. 2, respectively. In FIGS. 4A and 4B, regions including each of the first and second connection vias CV1 and CV2 are illustrated.

Referring to FIG. 4A, the first region R1 may be a region corresponding to the first substrate structure 100 of FIG. 3 and may have first connection vias CV1 therein. The first connection vias CV1 may include first pad connection vias CV1A in the first pad region PA1 and first interconnection vias CV1B in the connection region CN.

The first pad connection vias CV1A may be on first sides of the first pads PAD1, for example, on first sides of the first pads PAD1 adjacent to the sensor array region SA. The first pad connection vias CV1A may be electrically connected to the first pads PAD1 in the pad region PAD, as illustrated in FIG. 3. The first pad connection vias CV1A may overlap at least partially the first pads PAD1 in a z direction or may be in contact with the first pads PAD1.

The respective first pad connection vias CV are successively disposed, while having a single elongated strip shape extending in an x direction in regions adjacent to upper and lower ends of the sensor array region SA. In example embodiments, the first pad connection vias CV1A may only be within the first pads PAD1, respectively. In this case, the respective groups of the first pad connection vias CV1A may be spaced apart from each other in the x direction along the first pads PAD1. Further, in example embodiments, when the first pads PAD1 are further disposed on right and left sides of the sensor array region SA, the first pad connection vias CV may be disposed on the right and left sides of the sensor array region SA.

The first interconnection vias CV may be within the connection region CN and may be on one side of the sensor array region SA. The first interconnection vias CV1B may be within the first interlayer insulating layer 120 to be electrically connected to the first wiring layers 140, as illustrated in the connection region CN of FIG. 3.

The first interconnection vias CV1B may have a different size from the first pad connection vias CV1A. The size of the first interconnection vias CV may be greater than that of the first pad connection via CV1A. For example, the first pad connection via CV1A may have a predetermined diameter, for example, ranging from about 0.3 μm to about 0.8 μm. The first interconnection via CV may have a predetermined diameter, for example, ranging from about 1.5 μm to about 3.5 μm. The relative sizes of the first interconnection via CV and the first pad connection via CV may vary among embodiments.

Referring to FIG. 4B, the second region R2 may be a region corresponding to the second substrate structure 200 of FIG. 3 and may have the second connection vias CV2 therein. The second connection vias CV2 may include second pad connection vias CV2A in the second pad region PA2 and second circuit connection vias CV2B in the logic circuit region LC.

The second pad connection vias CV2A may be on same sides of the second pads PAD2, for example, on same sides of the second pads PAD2 adjacent to the sensor array region SA. The second pad connection vias CV2A may be electrically connected to the first pad connection via CV1A in the first pad region PA1 or pad region PAD, as illustrated in FIG. 3. Thus, the second pad connection vias CV2A may transmit driving current to, for example, the memory chip 310. The second pad connection vias CV2A may only be on one side of a portion of the second pads PAD2. In example embodiments, the second pad connection vias CV2A may also be disposed on one side of the entirety of the second pads PAD2.

The second circuit connection vias CV2B may be in the logic circuit region LC, and may disposed on one side of the ramp region RMP in the x direction, as illustrated in FIG. 4B. The second circuit connection vias CV2B may be electrically connected to the first interconnection vias CV in the connection region CN or the connection region CONNECT, as illustrated in FIG. 3. Thus, the second circuit connection vias CV2B may transmit image data to, for example, the memory chip 310.

FIG. 5 illustrates an embodiment of the first region R1 together with the second connection vias CV2 in the second region R2. As illustrated in FIG. 5, the first pad connection vias CV1A and the second pad connection vias CV2A may be in different positions with respect to each other on a plane and may also be adjacent to each other. The first pad connection vias CV1A may be closer to the first pads PAD1 than the second pad connection vias CV2A in the z direction, and at least a portion of the first pad connection via CV may overlap the first pads PAD1.

The first interconnection vias CV1B and the second circuit connection vias CV2B may be in different positions on a plane. The second circuit connection vias CV2B may be in an inner region of the second region R2, such that the second circuit connection vias CV2B may be closer to a center on a plane than the first interconnection vias CV1B.

Figure 6A:
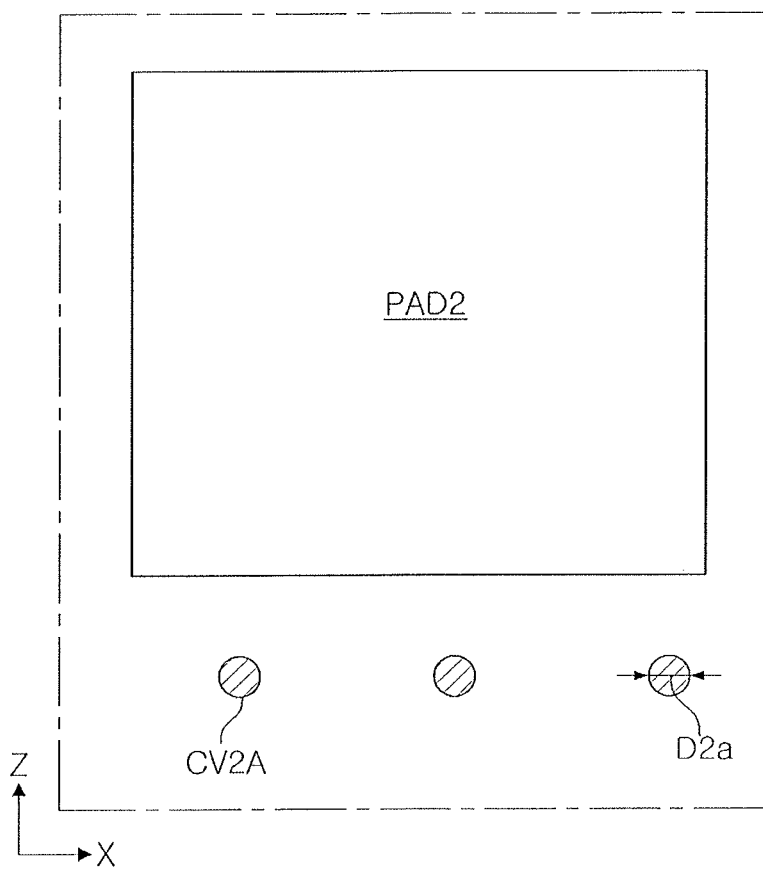
FIGS. 6A and 6B illustrate additional embodiments of second connection vias.
Figure 6B:
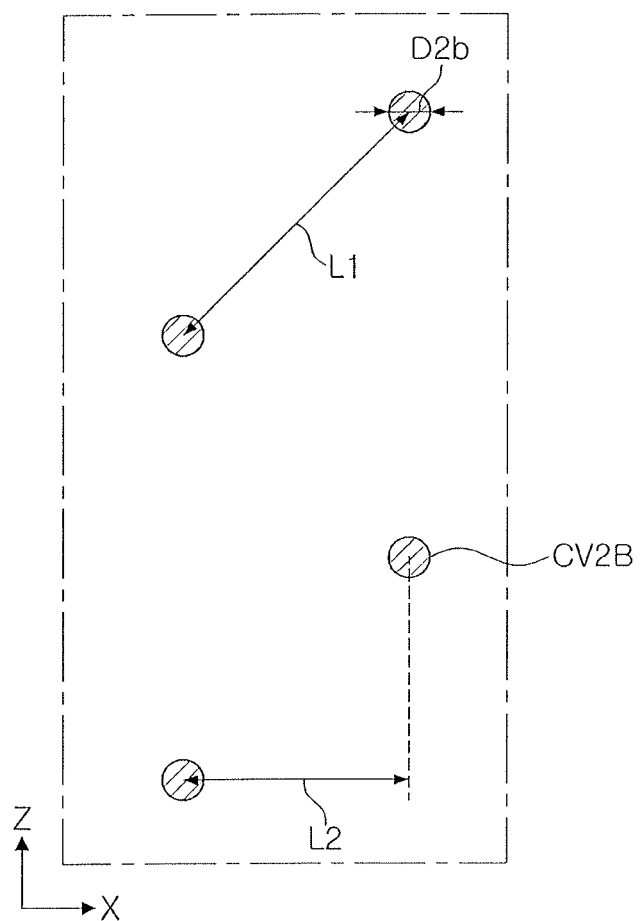

FIGS. 6A and 6B illustrate additional layout embodiments of second connection vias in an image sensing apparatus. FIG. 6A illustrates a layout embodiment of the second pad connection vias CV2A around the second pads PAD2. Two or more, for example, three, of the second pad connection vias CV2A may be disposed for each of the second pads PAD2. As described above, a plurality of second pad connection vias CV2A may be disposed for each second pad PAD2. Thus, IR drop may be prevented when an electrical signal is transmitted. The second pad connection vias CV2A may be on the same sides of the second pads PAD2 in a row in the x direction. A diameter D2a of the second pad connection via CV2A may be in a predetermined range, for example, from 4 µm to 10 µm.

FIG. 6B illustrates a layout embodiment of the second circuit connection vias CV2B in the logic circuit region LC. The second circuit connection vias CV2B may be at the same pitch as the second pad connection vias CV2A and may also have a different pattern from the second pad connection vias CV2A.

The second circuit connection vias CV2B may be in two columns in the z direction. A diameter D2b of the second circuit connection via CV2B may be the same as, or different from, the diameter D2a of the second pad connection via CV2A, which may range, for example, from 4 µm to 10 µm. The second circuit connection vias CV2B may be disposed in a zigzag pattern. In the zigzag pattern, the second circuit connection vias CV2B may be arranged at high density, while having a first length L1, a minimum pitch. The first length L1 may range, for example, from 30 µm to 60 µm. The first length L1 may be greater than a second length L2, which may correspond to an interval between the two columns. The second circuit connection vias CV2B may be in the zigzag pattern and arranged at relatively high density within a region having a predetermined width. Thus, spatial efficiency of the logic circuit region LC may be improved.

In example embodiments, the second circuit connection vias CV2B may also be disposed in three or more columns. For example, when the second circuit connection vias CV2B are disposed in five or more columns, other second circuit connection vias CV2B surrounding one second circuit connection vias CV2B may be in a hexagonal shape.

Figure 7A:
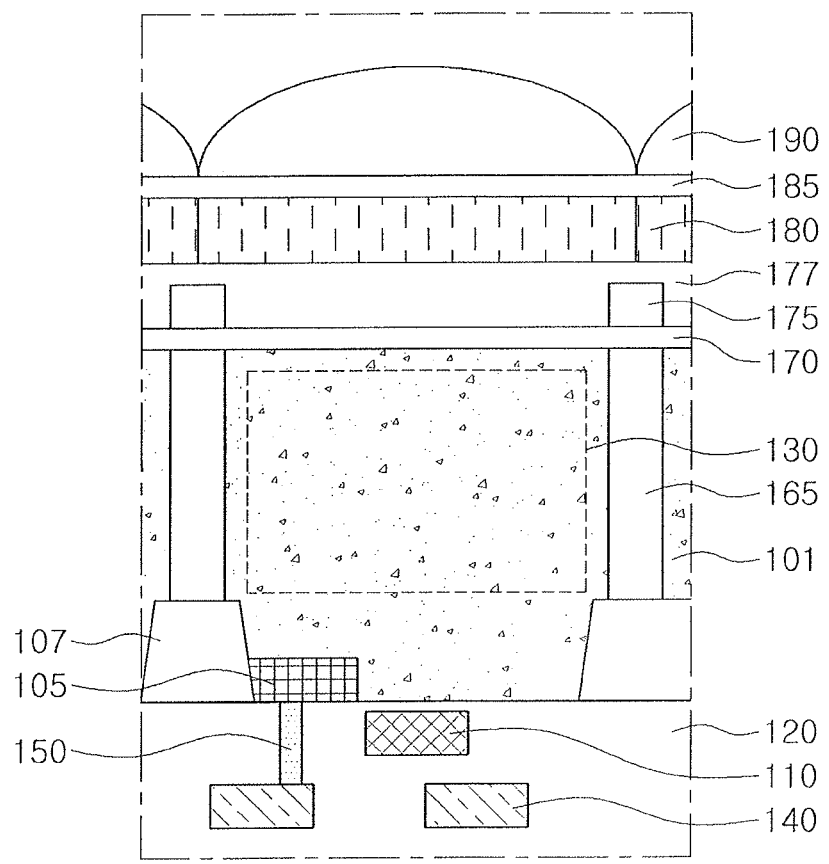
FIGS. 7A and 7B illustrate an embodiment of pixels.
Figure 7B:
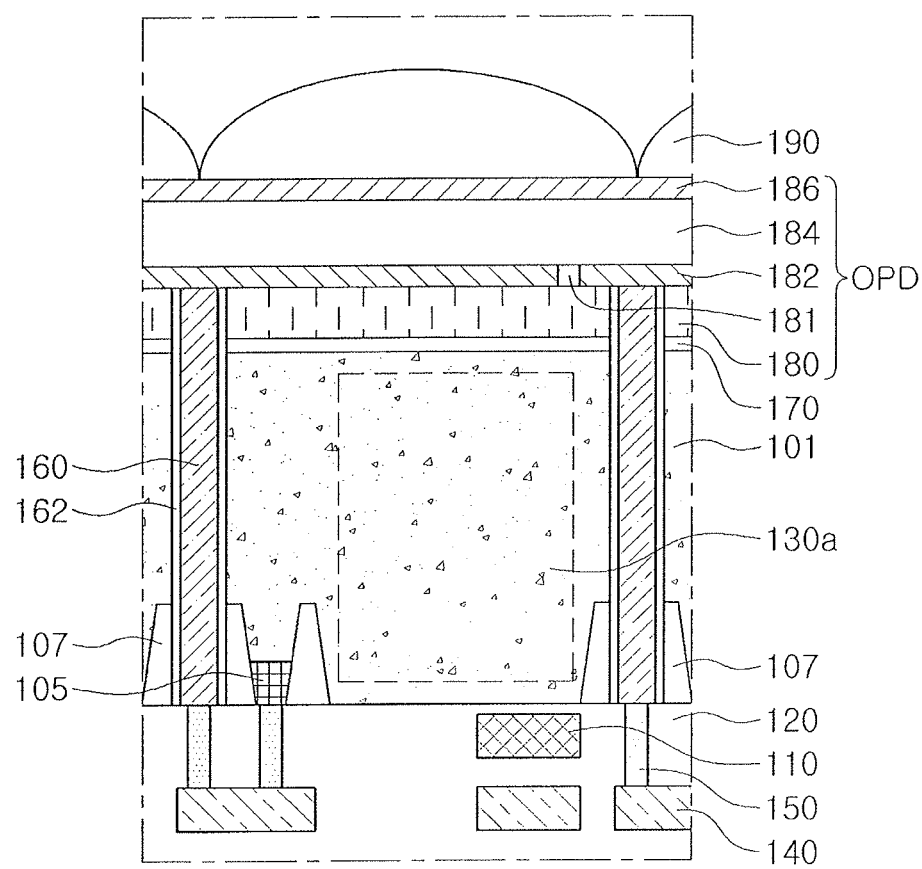

FIGS. 7A and 7B illustrate, in cross-section, embodiments of pixels forming a pixel region of an image sensing apparatus, according to example embodiments. FIGS. 7A and 7B illustrate enlarged views of region P of FIG. 3.

Referring to FIG. 7A, a pixel Pa may include the storage node region 105, element isolation regions 107, the photodiode 130, and the pixel isolation regions 165 within the first substrate 101. The pixel Pa may include the pixel gate layer 110, the first wiring layers 140, and the first via 150 within the first interlayer insulating layer 120. The pixel Pa may include the buffer layer 170, the grids 175, the lower planarization layer 177, the color filter 180, the upper planarization layer 185, and the microlens 190 above the first substrate 101.

The storage node region 105 may be within the first substrate 101 and spaced apart from the photodiode 130 by the element isolation regions 107. The storage node region 105 may include impurities of a conductivity type different from that of the first substrate 101. The storage node region 105 may be a region corresponding to a floating diffusion FD, for example, as described with reference to FIGS. 8A and 8B.

The element isolation regions 107 may extend from one surface of the first substrate 101 into the first substrate 101 and may be a region formed of an insulating material.

The photodiode 130 may be within the first substrate 101 and may absorb incident light as a photoelectric conversion element to generate and accumulate electric charges corresponding to intensity of the light. The photodiode 130 may include an impurity region having a conductivity type different from that of the first substrate 101, and may make a p-n junction with a well region within the first substrate 101.

The pixel isolation regions 165 may be below the boundary between the respective pixels Pa. The pixel isolation regions 165 may surround the photodiode 130. The relative arrangement relationship between the pixel isolation regions 165 and the photodiode 130 may be different in another embodiment. For example, lower surfaces of the pixel isolation regions 165 may be higher or lower than a lower surface of the photodiode 130. The pixel isolation regions 165 may include an insulating material or a conductive material. For example, when the pixel isolation regions 165 include a conductive material, an insulating layer may be further disposed between the pixel isolation regions 165 and the first substrate 101.

The pixel gate layer 110 may be between the first wiring layer 140 and the photodiode 130. The pixel gate layer 110 may correspond to a gate electrode of a pixel circuit element of the pixel Pa.

The first wiring layers 140 and the first via 150 may be within the first interlayer insulating layer 120 and electrically connected to the storage node region 105 and the photodiode 130 within the first substrate 101. The first wiring layers 140 may be parallel to one surface of the first substrate 101. The first via 150 may be perpendicular to the one surface of the first substrate 101 and, for example, may have a cylindrical shape or a truncated cone shape. Each of the first wiring layers 140 and the first via 150 may include a conductive material, for example, at least one of tungsten (W), copper (Cu), aluminum (Al), gold (Au), silver (Ag), and any alloy thereof. The number of the first wiring layers 140 and the number and an arrangement of the first via 150 may vary among embodiments.

The buffer layer 170 may be on the photodiode 130 and the pixel isolation regions 165. The buffer layer 170 may include an insulating material (e.g., at least one of $SiO_2$, SiON, $Al_2O_3$, $HfO_2$, $Ta_2O_5$, or $ZrO_2$) and may include a multilayer film of different materials. In example embodiments, an anti-reflective layer may be further provided below the buffer layer 170. The anti-reflective layer may allow a refractive index of incident light to be adjusted, to allow the light to travel to the photodiode 130 with a high level of transmittance.

The grids 175 may be on the buffer layer 170 and below the boundary between the respective pixels Pa. The grids 175 may be above the pixel isolation regions 165 in a direction perpendicular to one surface of the first substrate 101. The grids 175 may include a metal, for example, aluminum (Al), chromium (Cr), molybdenum (Mo), titanium (Ti), or tungsten (W). In example embodiments, the grids 175 may also be within the color filter 180. In this case, the lower planarization layer 177 may be omitted.

The lower planarization layer 177 may be on the buffer layer 170 and the grids 175. The lower planarization layer 177 may completely cover the grids 175, and may have an upper surface higher than that of each of the grids 175. The lower planarization layer 177 may include an insulating material, for example, a silicon oxide.

The color filter 180 may be on the lower planarization layer 177. The color filter 180 may be above the photodiode 130. The color filter 180 may pass light having a certain wavelength, such that the light may reach the photodiode 130 therebelow. The color filters 180 may be implemented as a color filter array including a red (R) filter, a green (G) filter, and a blue (B) filter. The color filter 180 may include, for example, a mixture of a resin, and a pigment including a metal or a metal oxide.

The upper planarization layer 185 may be on the color filter 180. The upper planarization layer 185 may include an insulating material, for example, a silicon oxide.

The microlens 190 may redirect a path of light received to a region, except for the photodiode 130, to concentrate the light on the photodiode 130. The microlens 190 may include, for example, a TMR-based resin (Tokyo Ohka Kogyo Co., Ltd.) or an MFR-based resin (JSR Corporation).

Referring to FIG. 7B, a pixel Pb may have a structure including an organic photodiode OPD in addition to a photodiode 130*a*, unlike in the example embodiment of FIG. 7A. For example, the pixel Pb may include the storage node region 105, the element isolation regions 107, the photodiode 130*a*, and pixel vias 160 within the first substrate 101. The pixel Pb may further include the pixel gate layer 110, the first wiring layers 140, and the first via 150 within the first interlayer insulating layer 120. The pixel Pb may include the buffer layer 170, the organic photodiode OPD, the color filter 180, and the microlens 190 on the first substrate 101.

The photodiode 130*a* may include a semiconductor material, as in the example embodiment of FIG. 7A.

The pixel vias 160 may be electrically isolated from the first substrate 101 and the photodiode 130*a* by pixel via insulating layers 162. The pixel vias 160 may include a conductive material and may connect the organic photodiode OPD to the first via 150. In example embodiments, the pixel vias 160 may also include two or more vias stacked in a vertical direction.

The organic photodiode OPD may be above the photodiode 130*a* and may receive light (having a color different from that of light received to the photodiode 130*a*) to generate electric charges. The organic photodiode OPD may include first and second electrode layers 182 and 186 facing each other, with an electrode insulating layer 181 between different portions of the first electrode layer 182. The first electrode layer 182 may be connected to the pixel vias 160. A color selection layer 184 may be between the first and second electrode layers 182 and 186 to generate electric charges based on a photoelectric effect. The color selection layer 184 may include an organic material, and may include a p-type layer having holes as main carriers and an n-type layer having electrons as main carriers. The color selection layer 184 may generate electric charges based on light having a specific wavelength band. For example, the color selection layer 184 may generate electric charges based on green color light. In this case, light having different colors, except for the green color, may be transferred to the photodiode 130*a* through the color filter 180.

Each of the first and second electrode layers 182 and 186 may include a transparent conductive material (e.g., ITO, IZO, ZnO, or $SnO_2$) or a semitransparent conductive material such as a metal thin film or another material. In example embodiments, the second electrode layer 186 may include a material having a work function greater than or equal to that of the first electrode layer 182.

The respective pixels Pa and Pb of FIGS. 7A and 7B may include photoelectric conversion elements (e.g., one or more photodiodes 130 and 130*a*) and may include pixel circuits processing electric charges generated by the photoelectric conversion elements.

Figure 8A:
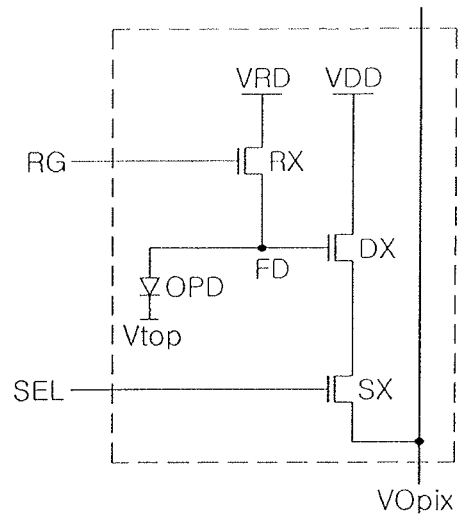
FIGS. 8A and 8B illustrate an embodiment of pixel circuits.
Figure 8B:
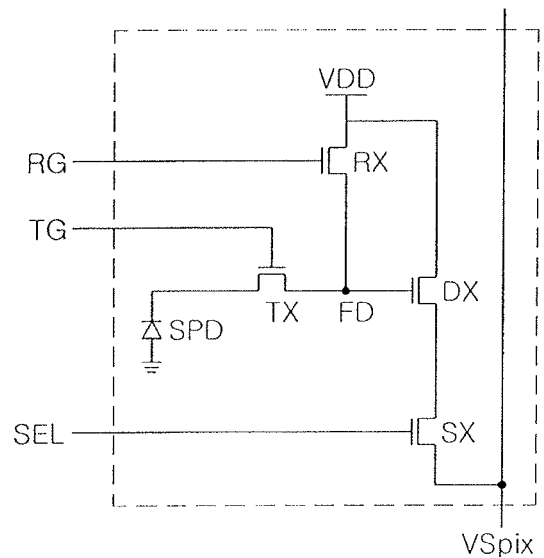

FIGS. 8A and 8B illustrate embodiments of the pixel circuits of an image sensing apparatus. Referring to FIG. 8A, the pixel circuit may generate an electrical signal using electric charges generated by an organic photodiode OPD.

The pixel circuit may include a plurality of transistors RX, DX, and SX, and may have, for example, a 3T circuit structure. The pixel circuit may include a reset transistor RX, a drive transistor DX, and a select transistor SX. A gate terminal of the drive transistor DX may be connected to a floating diffusion FD. Electric charges generated by the organic photodiode OPD may be accumulated in the floating diffusion FD. The organic photodiode OPD may include first and second electrodes parallel to each other, with an organic photoconversion layer therebetween. The organic photoconversion layer may receive light having a predetermined wavelength band and generate electric charges.

The drive transistor DX may operate as a source follower buffer amplifier by electric charges accumulated in the floating diffusion FD. The drive transistor DX may amplify electric charges accumulated in the floating diffusion FD and transfer the amplified electric charges to the select transistor SX.

The select transistor SX may be operated based on a select control signal SEL input by a row driver and may perform switching and addressing operations. For example, when the select control signal SEL is applied from the row driver, a first pixel signal VOpix may be output to a first column line connected to the select transistor SX. The first pixel signal VOpix may be detected by a column driver and a readout circuit.

The reset transistor RX may be operated based on a reset control signal RG input by the row driver. The reset transistor RX may reset a voltage of the floating diffusion FD to a readout voltage VRD, in response to the reset control signal RG.

In the example embodiment, the organic photodiode OPD may use holes as main charge carriers. For example, when the hole is used as the main charge carrier, a cathode of the organic photodiode OPD may be connected to the floating diffusion FD and an anode of the organic photodiode OPD may be connected to an upper electrode voltage Vtop. The upper electrode voltage Vtop may have a voltage of a few volts, for example, about 3.0 V. Since the hole is generated as the main charge carrier in the organic photodiode OPD, a drain terminal of the reset transistor RX may be connected to the readout voltage VRD having a voltage level different from that of a power supply voltage VDD. Dark current characteristics may be improved by implementing the pixel circuit to use the hole as the main charge carrier. In example embodiments, the organic photodiode OPD may also generate electrons as main charge carriers and may have a resulting circuit structure.

Referring to the embodiment of FIG. 8B, the pixel circuit may generate an electrical signal using electric charges generated by a semiconductor photodiode SPD. The pixel circuit may have a 4T circuit including four transistors. The pixel circuit may further include a transfer transistor TX, in addition to a reset transistor RX, a drive transistor DX, a select transistor SX.

The semiconductor photodiode SPD is connected to the pixel circuit, may be a semiconductor photodiode formed on a semiconductor substrate including silicon or the like, and may be connected to a floating diffusion region FD through the transfer transistor TX. For example, unlike in the example embodiment of FIG. 8A, a cathode or an anode of the semiconductor photodiode SPD may not be directly connected to the floating diffusion region FD.

The transfer transistor TX may transfer electric charges accumulated in the semiconductor photodiode SPD to the floating diffusion region FD based on a transfer control signal TG from a row driver. The semiconductor photodiode SPD may generate electrons as main charge carriers. Operations of the reset transistor RX, the drive transistor DX, and the select transistor SX may be similar to those described with reference to FIG. 8A. A second pixel signal VSpix may be output through a second column line connected to the select transistor SX. The second pixel signal VSpix may be detected by a column driver and a readout circuit.

Figure 9:
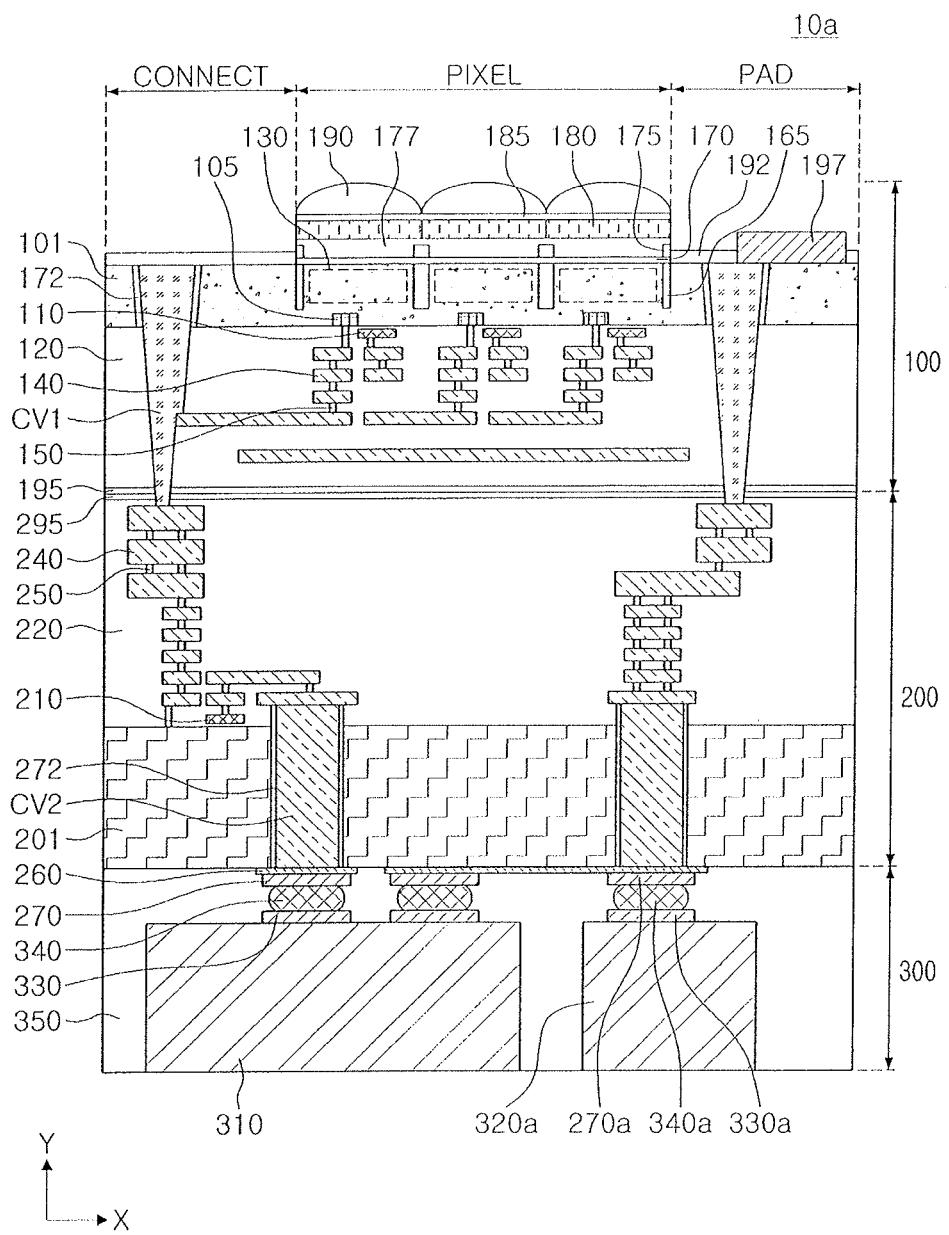
FIG. 9 illustrates another embodiment of an image sensing apparatus.

FIG. 9 illustrates, in cross-section, another embodiment of an image sensing apparatus 10a. Referring to FIG. 9, unlike in the example embodiment of FIG. 3, the image sensing apparatus 10a may include a chip structure 300 having a logic chip 320a in addition to a memory chip 310. The logic chip 320a may have an upper surface (which may be an active surface) bonded to a lower surface of a second substrate 201 in a flip-chip bonding manner. In one embodiment, the logic chip 320a may be parallel to the memory chip 310, and may have a side surface and an upper surface covered by an encapsulation portion 350.

The logic chip 320a may be a microprocessor chip which includes, for example, a central processing unit (CPU), a controller, or an application-specific integrated circuit (ASIC) chip. The logic chip 320a may receive image data from a second substrate structure 200 and process the image data. The logic chip 320a may be electrically connected to the second substrate structure 200 through a second connection pad 330a and through a bump 340a. In example embodiments, the logic chip 320a may be directly connected to the memory chip 310 through a redistribution structure.

In example embodiments, the image sensing apparatus 10a may also include all of the logic chip 320a, and the dummy chip 320 according to the example embodiment of FIG. 3.

Figure 10:
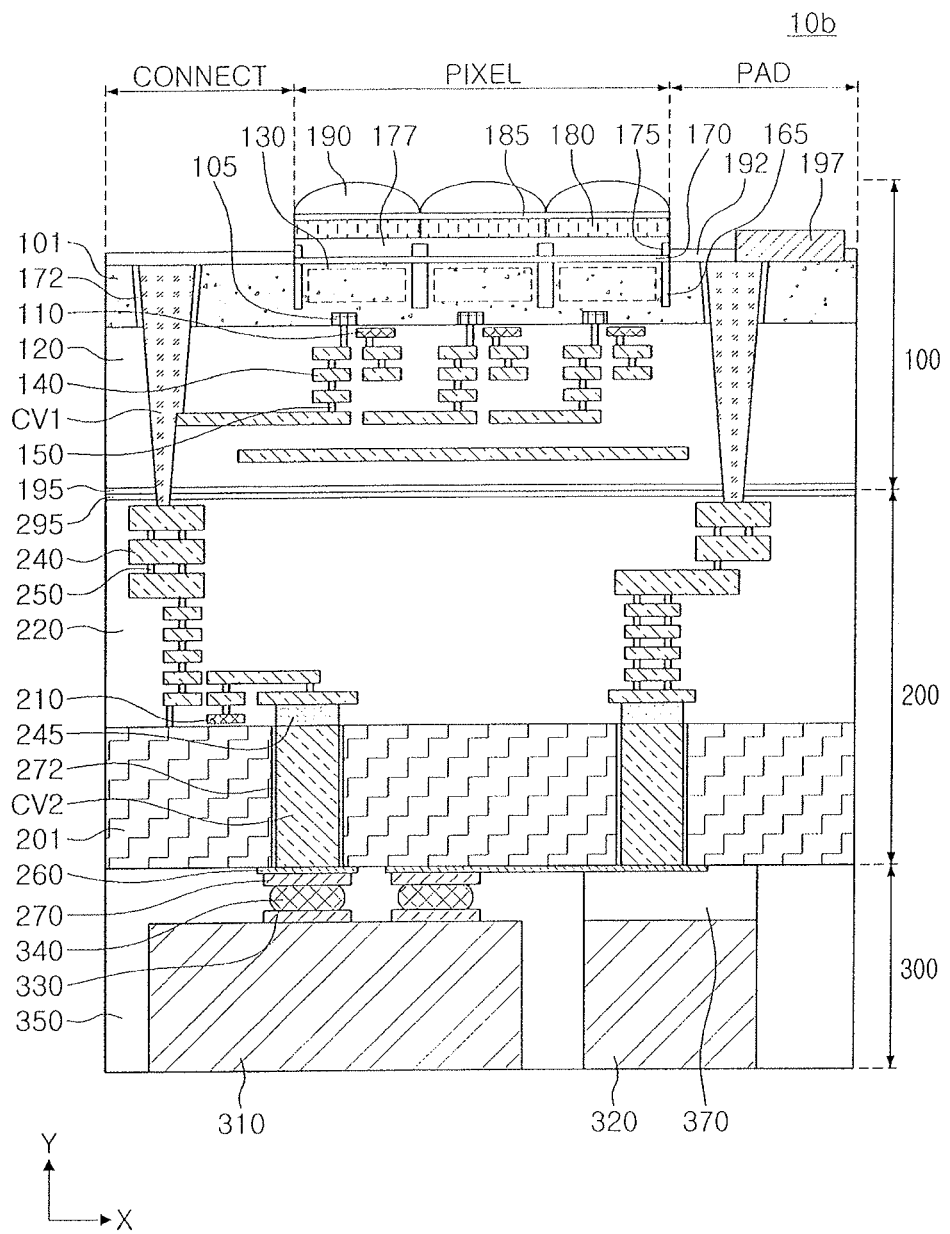
FIG. 10 illustrates another embodiment of an image sensing apparatus.

FIG. 10 illustrates, in cross-section, another embodiment of an image sensing apparatus 10b. Referring to FIG. 10, unlike in the example embodiment of FIG. 3, an image sensing apparatus 10b may have second connection vias CV2 only extending to an upper surface of a second substrate 201. In this case, the second connection vias CV2 may be connected to second wiring layers 240 through separate connection vias 245. The structure of the second connection via CV2, as described above, may be formed by a process of forming the second connection via CV2. For example, the second connection via CV2 may be formed by a via-first process of forming a via prior to formation of circuit elements or by a via-last process of forming a via subsequent to formation of a wiring structure.

The connection via 245 may include a conductive material and may have a size similar to that of the second connection via CV2. The shape of the connection via 245 may be different in other embodiments. The connection via 245 may, for example, also have a structure including a plurality of second vias 250.

Figure 11A:
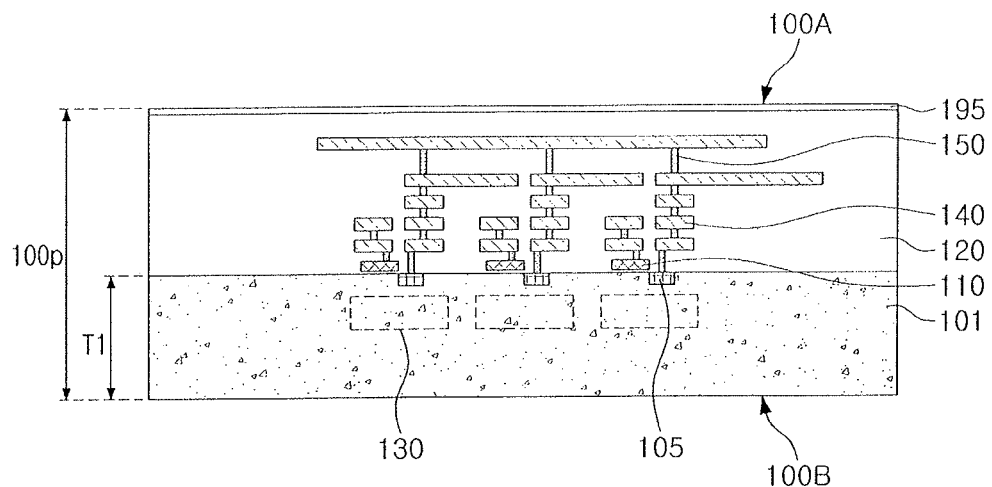
FIGS. 11A to 11L illustrate various stages corresponding to an embodiment of a method for manufacturing an image sensing apparatus.

FIGS. 11A to 11I illustrates various stages corresponding to an embodiment of a method for manufacturing an image sensing apparatus. Referring to FIG. 11A, the method includes forming a first region of a pixel region on a first substrate structure 100p. In the process, components in a first substrate 101 and those in a first interlayer insulating layer 120 may be formed in the pixel region PIXEL of FIG. 3.

The first substrate 101 may have a first thickness T1 greater than an ultimate thickness of the first substrate 101 of FIG. 3. The components formed within the first substrate 101 may include including storage node regions 105 and photodiodes 130. The storage node regions 105 and the photodiodes 130 may be formed, for example, by injecting impurities into the first substrate 101 through an ion implantation process. In one example embodiment, the storage node regions 105 may be formed by injecting n-type impurities into the first substrate 101. Each of the photodiodes 130 may include an n-type impurity region.

Subsequently, pixel gate layers 110, first wiring layers 140, and first vias 150 may be formed on the first substrate 101 corresponding to a pixel circuit. Subsequent to formation of the pixel gate layer 110, at least a portion of the first interlayer insulating layer 120 may be formed on an upper surface of the first substrate 101. The first interlayer insulating layer 120 may be formed in part in the process of forming the first wiring layers 140 and the first vias 150, to ultimately cover the components on the first substrate 101. A first bonding layer 195 may be formed on an upper surface of the first interlayer insulating layer 120. In the process, the first substrate structure 100p (including the first substrate 101 and the first interlayer insulating layer 120, in which the first region with a portion of the pixel region is formed) may have a first surface 100A and a second surface 100B.

Figure 11B:
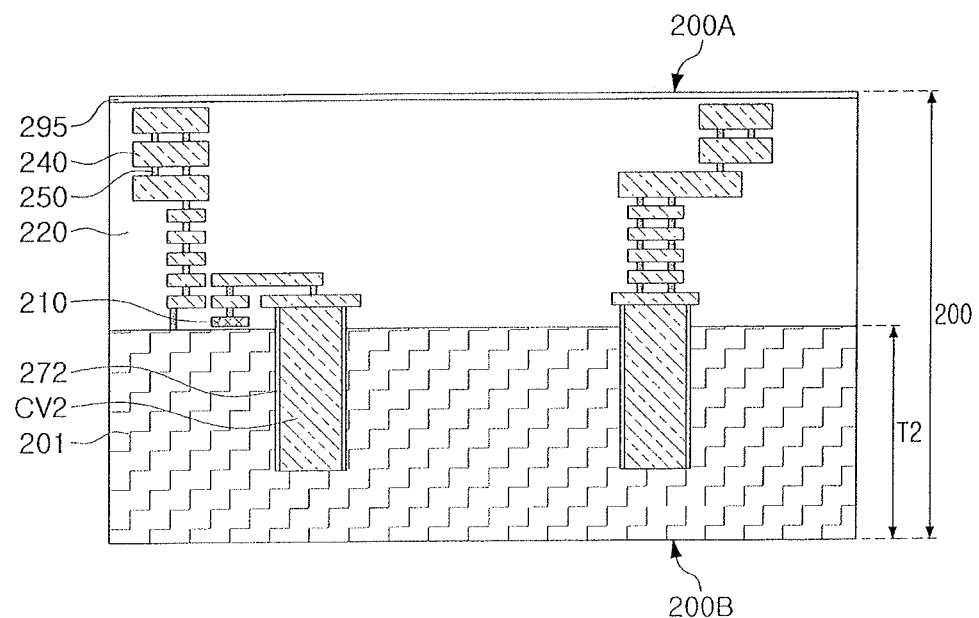

Referring to FIG. 11B, a circuit region and second connection vias CV2 may be formed in a second substrate structure 200. A second substrate 201 may have a second thickness T2 greater than an ultimate thickness of the second substrate 201 of FIG. 3. Regions for circuit configuration (e.g., an element isolation region and an impurity region)

may be formed in the second substrate 201. Then, circuit gate layers 210 may be formed on the second substrate 201.

Subsequently, a portion of a second interlayer insulating layer 220 may be formed to cover the circuit gate layers 210. The second interlayer insulating layer 220 and the second substrate 201 may be etched to predetermined depths from upper surfaces thereof to form holes. The holes may be filled with an insulating material and a conductive material, so that second via insulating layers 272 and the second connection vias CV2 may be formed. In the example embodiment, the second connection vias CV2 may be formed by a via-middle process of forming a via prior to formation of a wiring after circuit elements are formed.

At least a portion of the second interlayer insulating layer 220 may be formed on the second substrate 201. Second wiring layers 240 and second vias 250 may be formed thereon. Ultimately, the second interlayer insulating layer 220 may cover all of the circuit gate layers 210, the second wiring layers 240, and the second vias 250. A second bonding layer 295 may be formed on an upper surface of the second interlayer insulating layer 220. In the process, the second substrate structure 200 (including the second substrate 201 and the second interlayer insulating layer 220, in which a circuit driving pixels is formed) may have a first surface 200A and a second surface 200B.

Figure 11C:
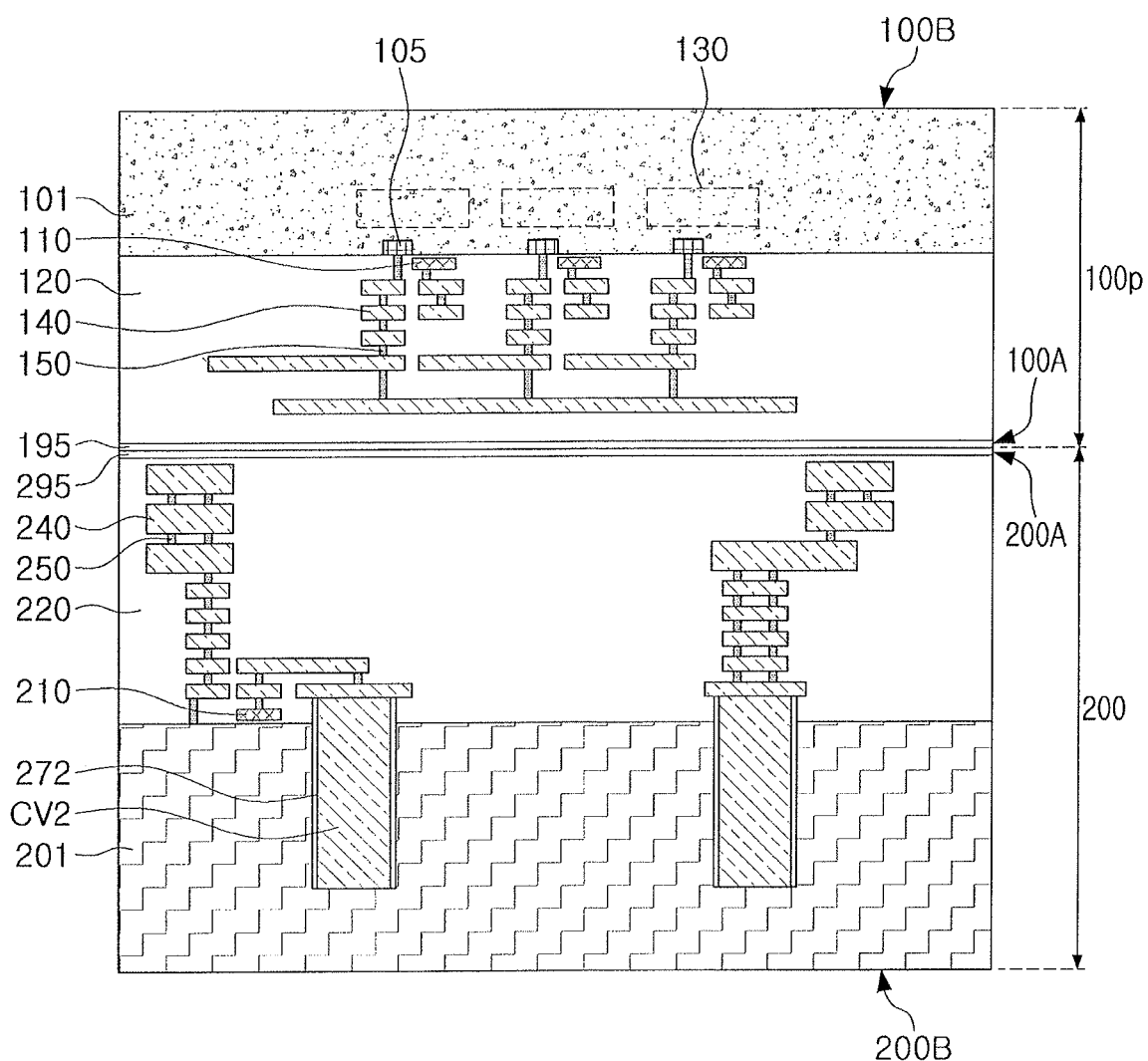

Referring to FIG. 11C, the first substrate structure 100p may be bonded to the second substrate structure 200. For example, the first substrate structure 100p and the second substrate structure 200 may be bonded by bonding the first surface 100A of the first substrate structure 100p to the first surface 200A of the second substrate structure 200. The first bonding layer 195 of the first substrate structure 100p and the second bonding layer 295 of the second substrate structure 200 may be bonded to each other. For example, when the first and second bonding layers 195 and 295 are formed of the same material, the first and second bonding layers 195 and 295 may be bonded by pressure without an additional bonding layer. The manner of bonding the first substrate structure 100p to the second substrate structure 200 may be different in another embodiment.

Figure 11D:
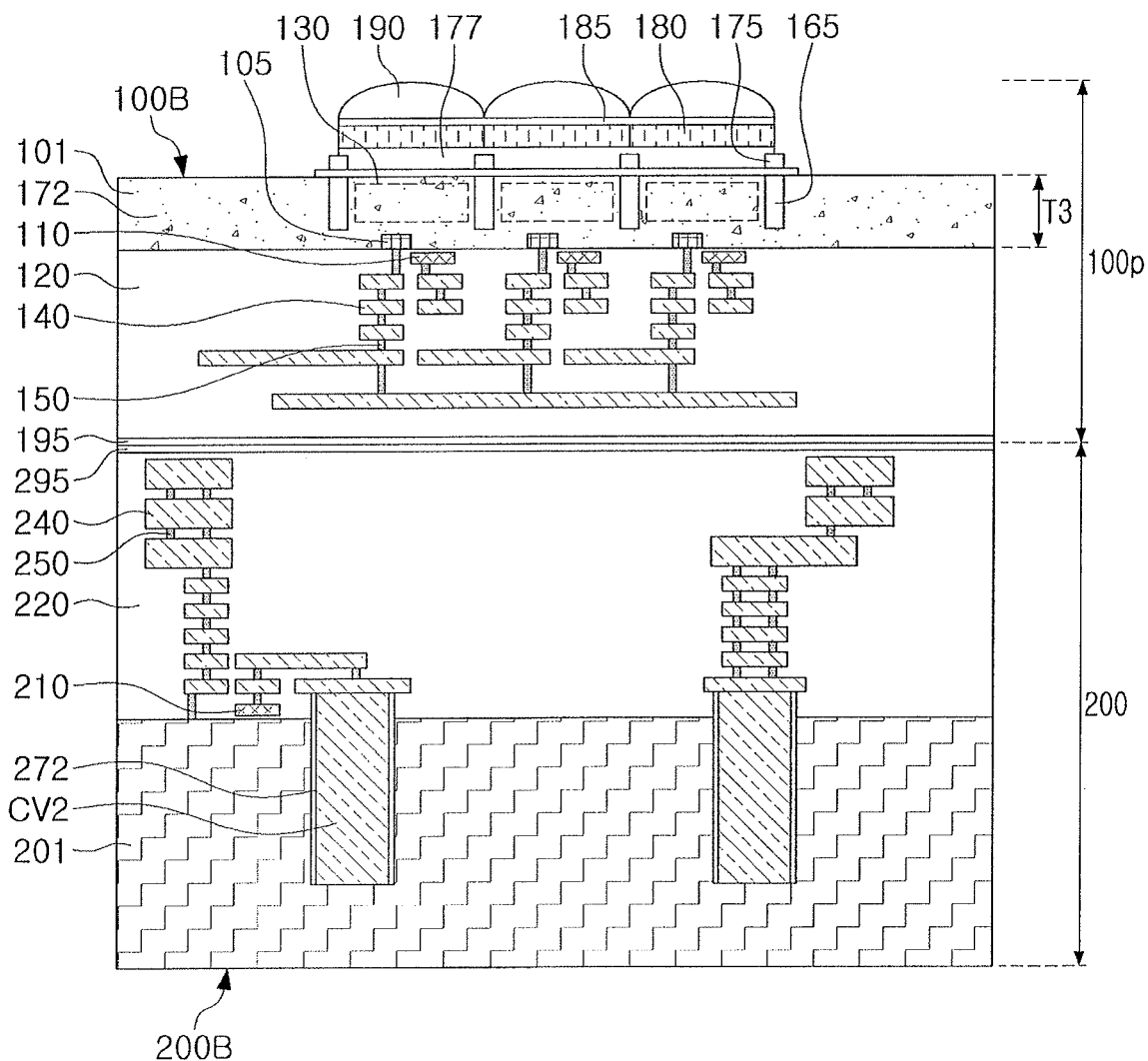

Referring to FIG. 11D, a second region of the pixel region may be formed on one surface of the first substrate structure 100p. In the process, components on the first substrate 101 may mainly be formed in the pixel region PIXEL of FIG. 3.

First, a process for thinning the first substrate 101 may be performed. The first substrate 101 may be removed from the second surface 100B of the first substrate structure 100p by a predetermined thickness, in order to have a third thickness T3 less than the first thickness T1 of FIG. 11A. A portion of the first substrate 101 may be removed, for example, by a polishing process or a back-grinding process.

Pixel isolation regions 165 may be formed to have a predetermined depth from an upper surface of the first substrate 101, of which the portion has been removed. Subsequently, a buffer layer 170 may be formed on the upper surface of the first substrate 101, and grids 175 may be formed in regions including boundaries of the pixels. A lower planarization layer 177 may be formed to cover the grids 175. Color filters 180 (for example, red (R), green (G), and blue (B) filters) may be formed in the respective pixels. An upper planarization layer 185 may be formed on the color filters 180, and microlenses 190 may be formed on the upper planarization layer 185.

Figure 11E:
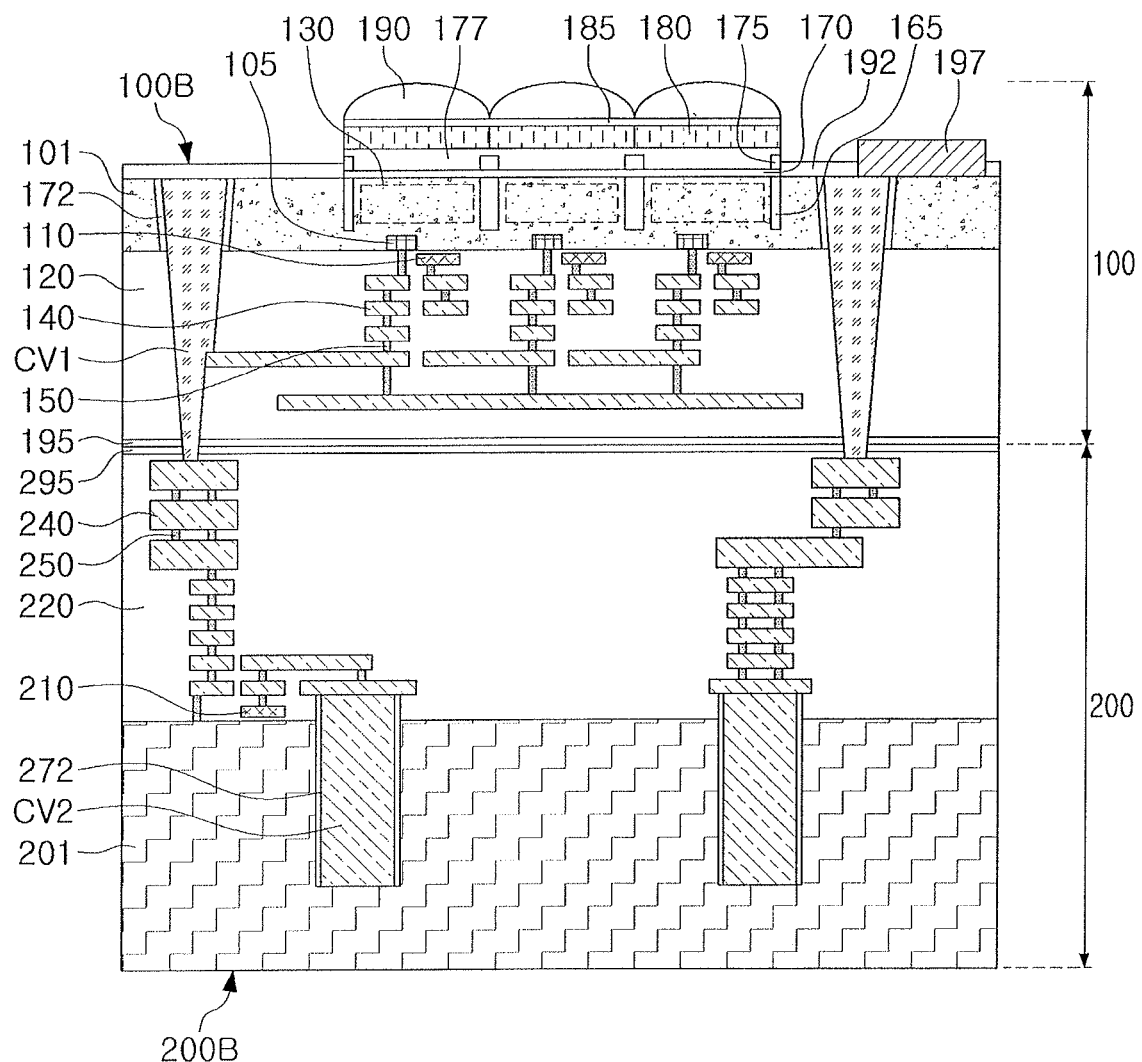

Referring to FIG. 11E, first connection vias CV1 may be formed to extend from one surface of the first substrate structure 100p. The first connection via CV1 may pass through the first substrate 101 and the first interlayer insulating layer 120, and may extend from the upper surface of the first substrate 101 into the second interlayer insulating layer 220. The first connection via CV1 may be connected to the uppermost second wiring layer 240 in the second interlayer insulating layer 220.

In example embodiments, extension lengths of the first connection vias CV1 may be different. For example, the first connection via CV1, formed in the connection region CONNECT of FIG. 3, may extend to at least one first wiring layer 140 within the first interlayer insulating layer 120. The first connection via CV1, formed in the pad region PAD, may extend into the second interlayer insulating layer 220.

A hole may be formed to extend from the upper surface of the first substrate 101. A conductive material may be deposited in the hole to form the first connection via CV1. A first via insulating layer 172 may be formed on a side surface of the first connection via CV1 in the first substrate 101.

Subsequently, an upper insulating layer 192 may be formed to cover the upper surface of the first substrate 101, and a pad layer 197 may be formed in the pad region PAD of FIG. 3 to connect to the first connection via CV1.

By this process, the first substrate structure 100 including the first substrate 101 may be completed. In example embodiments, a test process for an image sensing unit (e.g., an image sensor) including the first and second substrate structures 100 and 200 may further be performed.

Figure 11F:
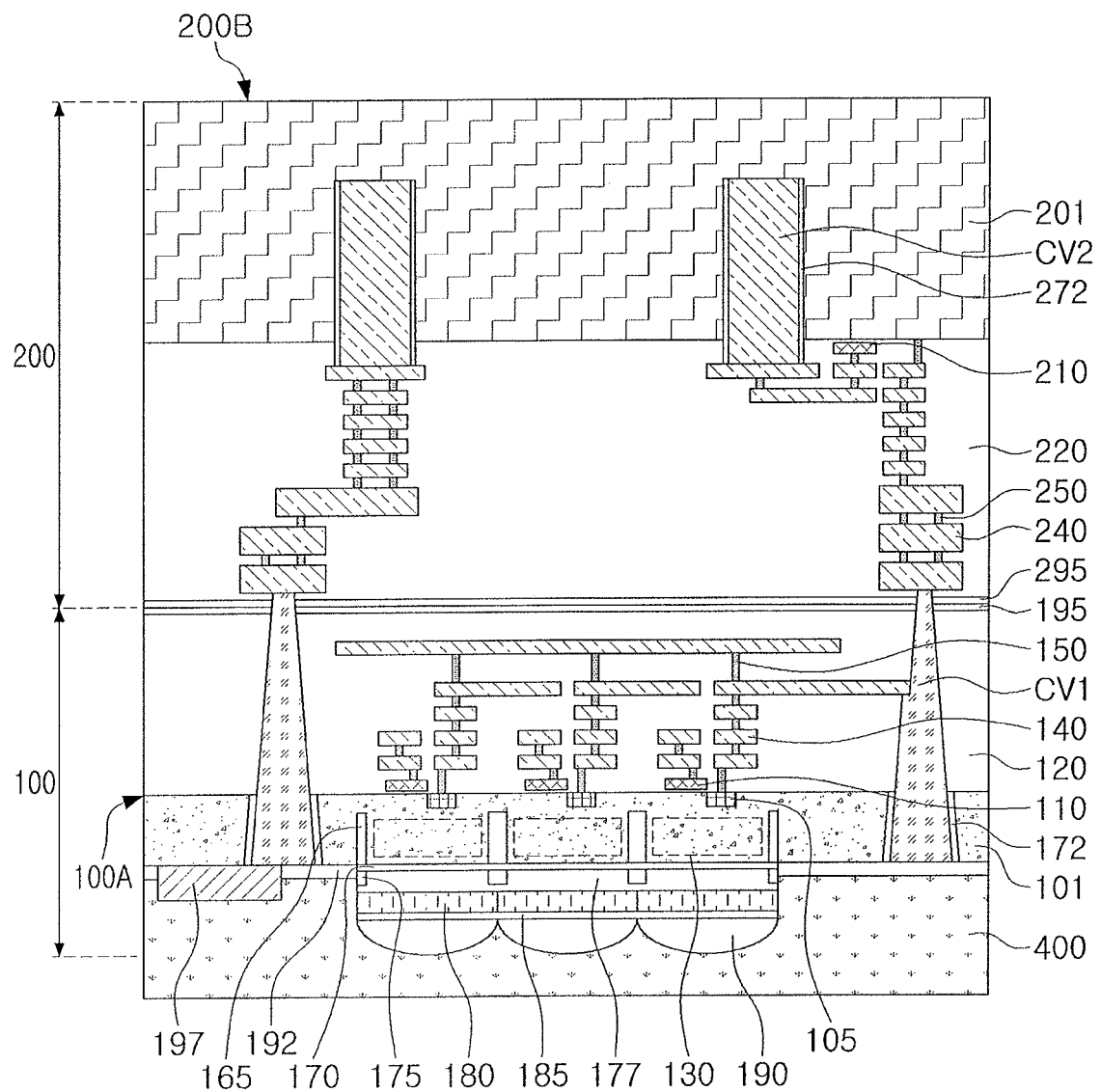

Referring to FIG. 11F, a carrier substrate 400 may be bonded to one surface of the first substrate structure 100. The carrier substrate 400 may be bonded to support a stack structure of the first and second substrate structures 100 and 200 in a subsequent process. The carrier substrate 400 may be bonded to the second surface 100B of the first substrate structure 100 using a bonding layer. The bonding layer may be formed, for example, of a material enabling the carrier substrate 400 to be attached thereto or detached therefrom in a subsequent process. In one embodiment, a film-type or liquid-type material may be used. The carrier substrate 400 may include, for example, a silicon (Si), germanium (Ge), silicon germanium (SiGe), gallium arsenide (GaAs), glass, plastic, or ceramic.

Figure 11G:
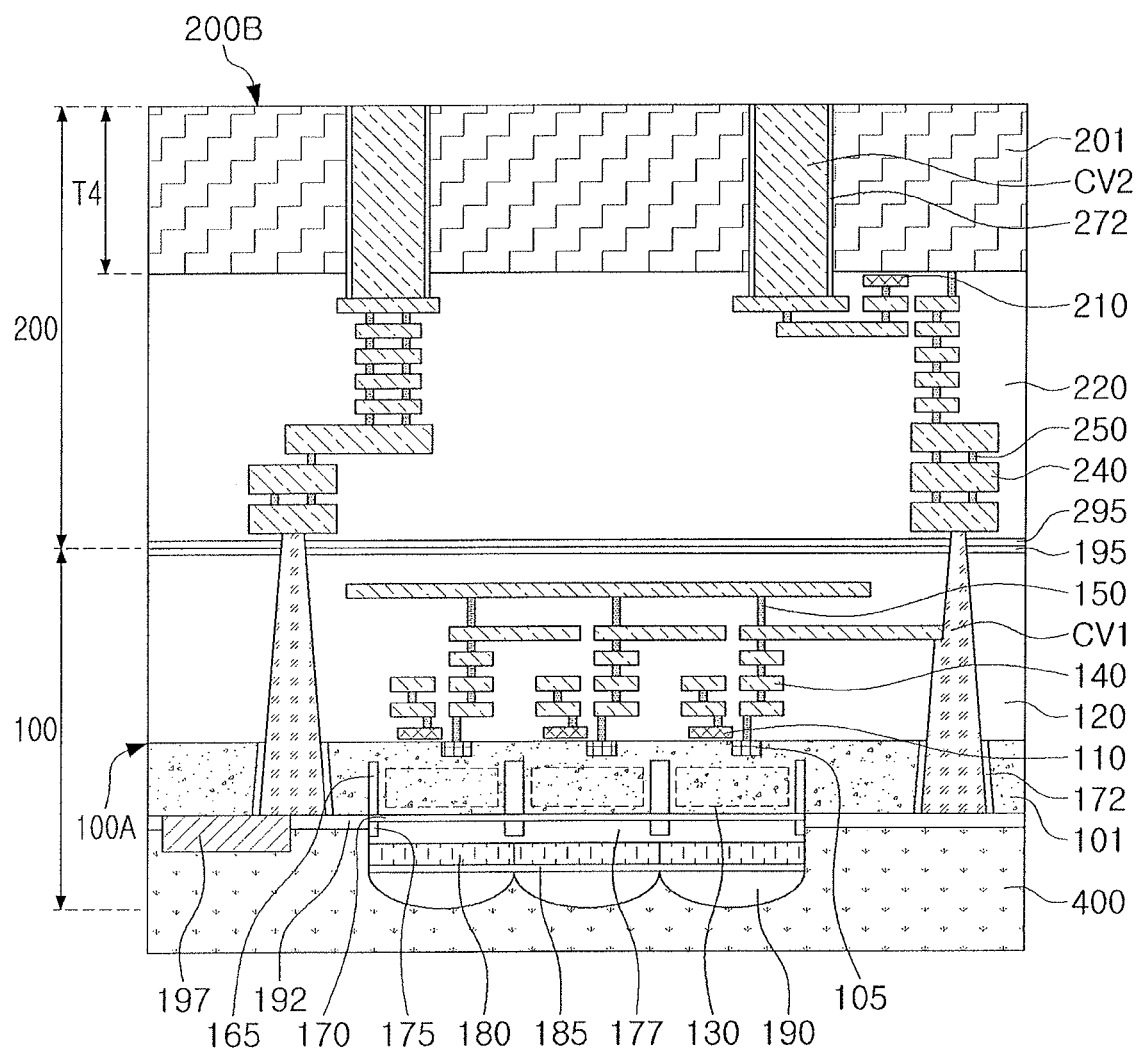

Referring to FIG. 11G, the second connection via CV2 may be exposed by removing a portion of the second substrate structure 200. A portion of the second substrate 201 may be removed from the second substrate structure 200, and the second substrate 201 may be thinned from an upper surface thereof corresponding to the second surface 200B of the second substrate structure 200. Accordingly, the second substrate 201 may have a fourth thickness T4 less than the second thickness T2 of FIG. 11B.

The image sensing apparatus 10b described with reference to FIG. 10 may be manufactured, for example, by removing a portion of the second substrate 201 in the process and then forming the second connection via CV2 within the second substrate structure 200.

Figure 11H:
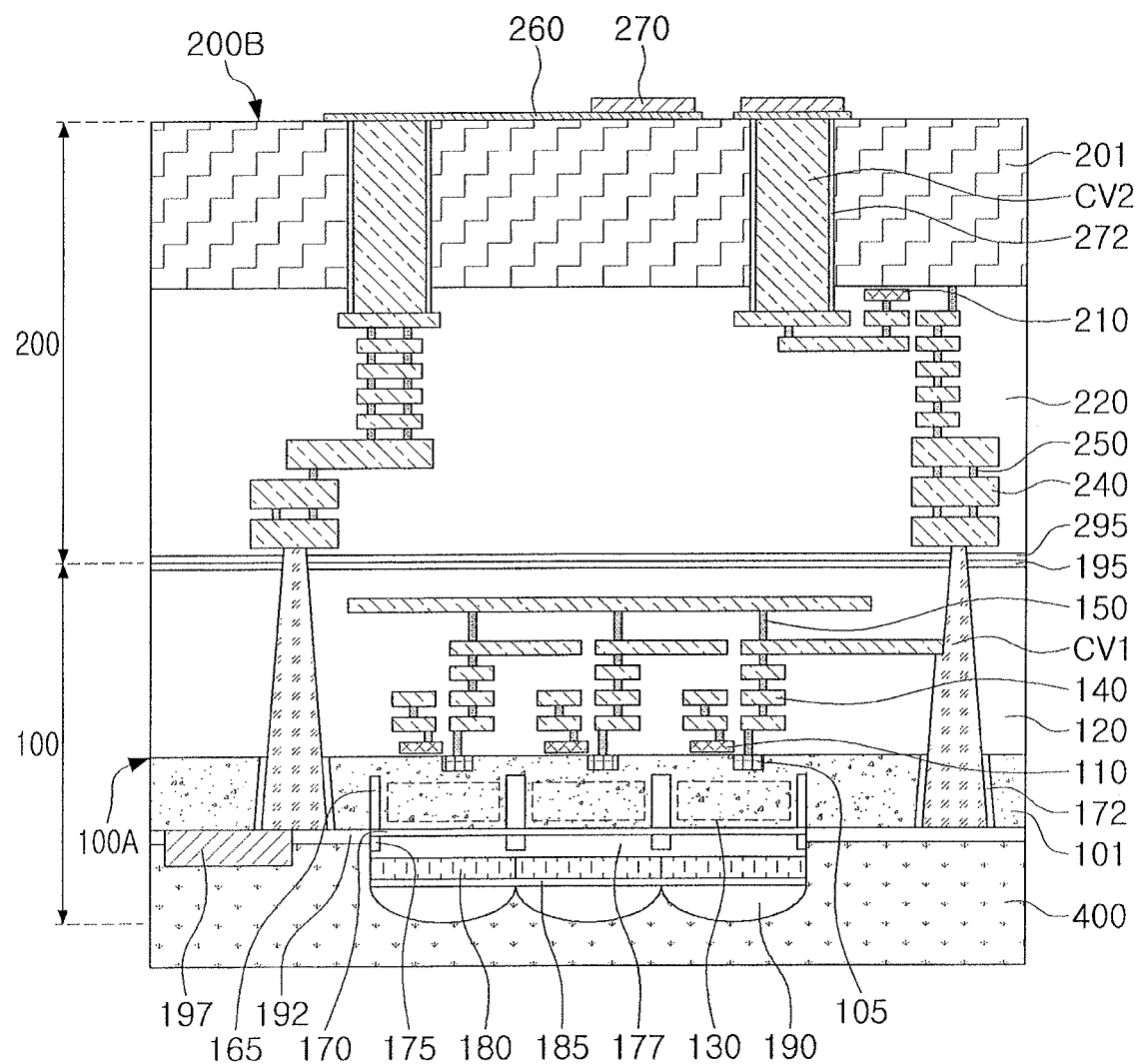

Referring to FIG. 11H, first connection pads 270 may be formed to be connected to the exposed second connection vias CV2. In addition to the first connection pad 270, the process may include forming a redistribution structure including a redistribution layer 260.

Figure 11I:
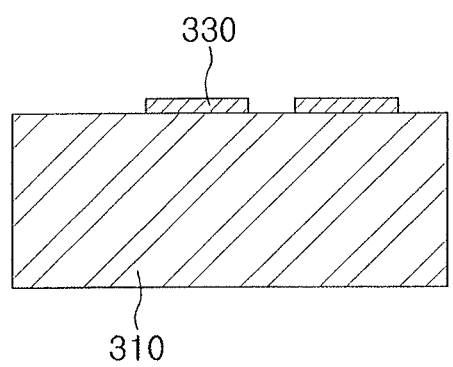

Referring to FIG. 11I, a semiconductor chip having second connection pads 330 formed on one surface thereof may be provided. The semiconductor chip may include a memory chip 310, which, for example, may be a tested chip, with the second connection pads 330 formed on an upper surface of the memory chip 310. When the memory chip 310 includes redistribution layers in addition to the second connection pad 330, the redistribution layer may be formed in this process.

Figure 11J:
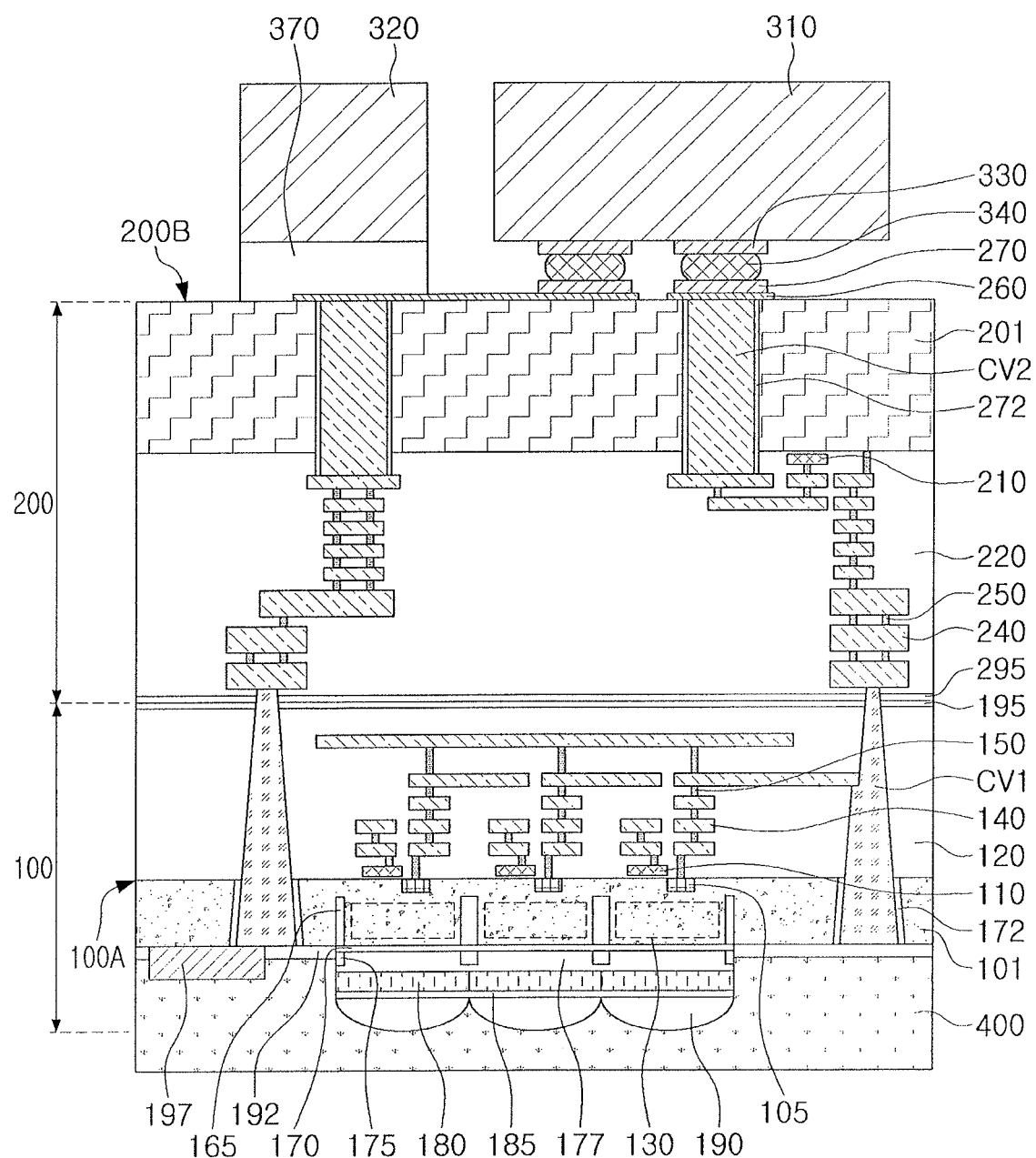

Referring to FIG. 11J, the semiconductor chip may be connected to the second substrate structure 200, for example, using bumps 340. The first connection pad 270 and the second connection pad 330 may be connected using the bump 340. Thus, the memory chip 310 may be mounted on a stack structure of the first and second substrate structures 100 and 200. In the process, a dummy chip 320 may be mounted together with the memory chip 310 and may be connected to the second substrate 201 by a bonding layer 370. The dummy chip 320 may also be connected to the second substrate 201 using a dummy bump, for example, in a manner similar to that of mounting the memory chip 310. The image sensing apparatus 10a described with reference to FIG. 9 may be fabricated by mounting a logic chip 320a, in the same manner as that for mounting the memory chip 310 in the process.

Figure 11K:
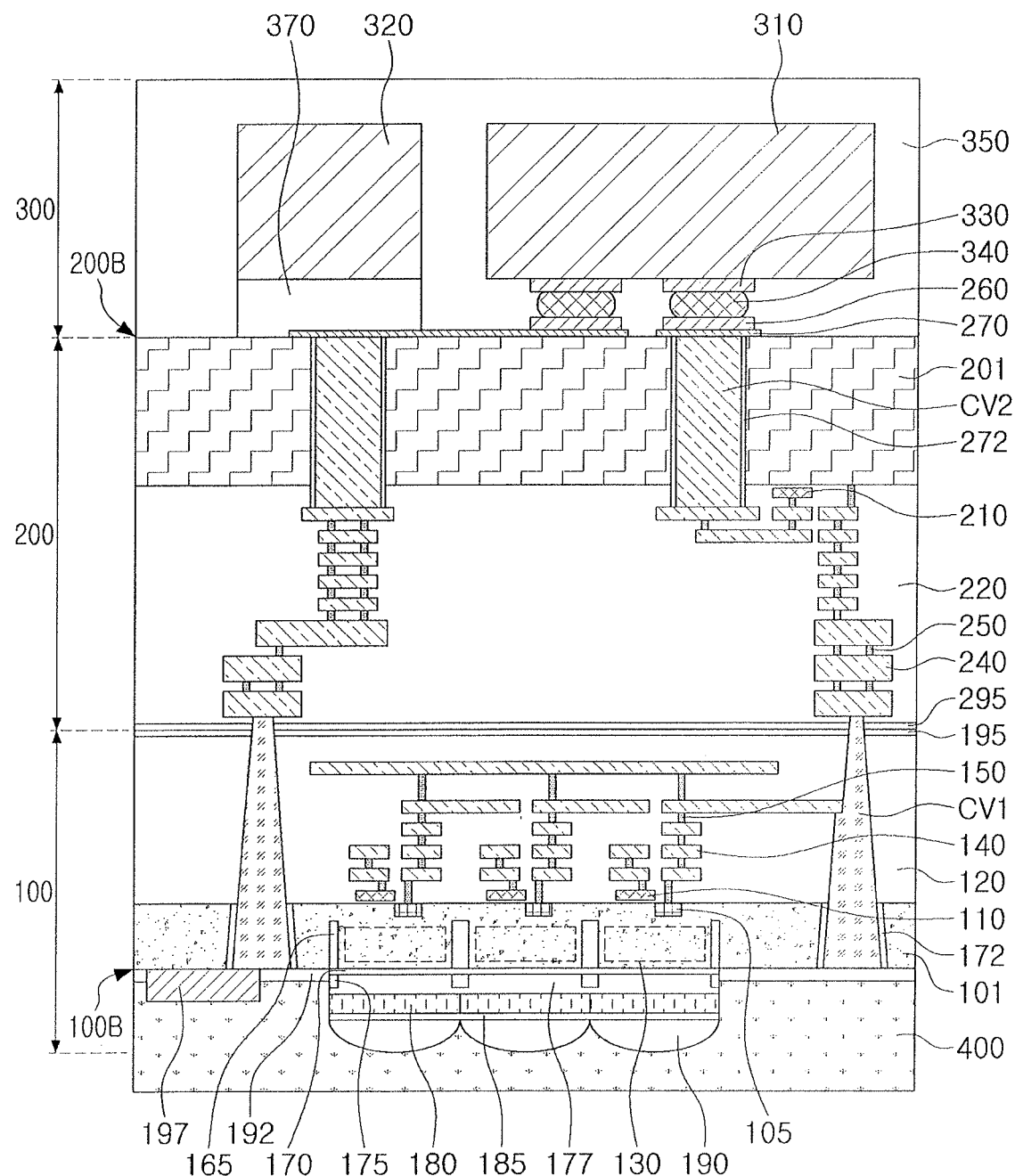

Referring to FIG. 11K, an encapsulation portion 350 may be formed to encapsulate the semiconductor chip. The encapsulation portion 350 may cover the memory chip 310 and the dummy chip 320 and may fill a space between the bumps 340. In example embodiments, the encapsulation portion 350 may have a multilayer structure and may include an under-fill portion filling the space between the bumps 340.

Figure 11L:
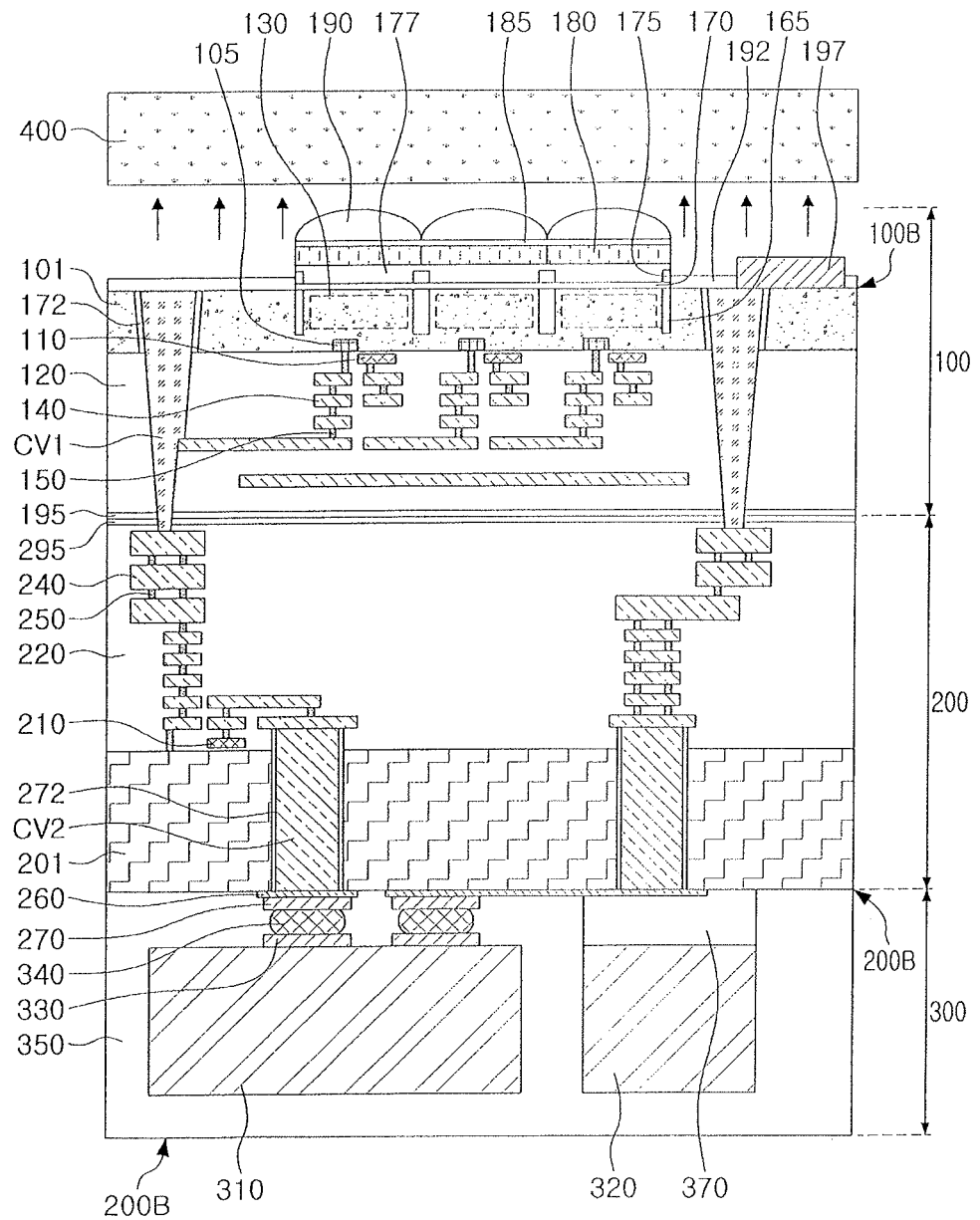

Referring to FIG. 11L, the carrier substrate 400 may be removed from the first substrate structure 100. After the carrier substrate 400 is detached from the first substrate structure 100, the bonding layer used in bonding the carrier substrate 400 may be removed, and a cleaning process may be performed. In example embodiments, a test process may be performed for an image sensing apparatus which includes the memory chip 310.

Referring to FIGS. 3 and 11L, a portion of the encapsulation portion 350 may be removed to expose one surface of the semiconductor chip. The portion of the encapsulation portion 350 may be removed, for example, by a grinding process to expose lower surfaces of the memory chip 310 and the dummy chip 320.

Subsequently, a process for separating the stack structure of the first and second substrate structures 100 and 200 (having the semiconductor chip mounted thereon) into unit image sensing apparatuses 10 may be performed. First, the stack structure of the first and second substrate structures 100 and 200 (having the memory chip 310 mounted thereon) may be separated into the unit image sensing apparatuses 10, for example, by a blade cutting process or a laser cutting process.

In accordance with one or more of the aforementioned embodiments, connection vias may be disposed in different positions in an image sensing apparatus having a stacked arrangement of a pixel region, a circuit region, and a semiconductor chip. As a result, an image sensing apparatus may be formed to have a compact size with improved image processing speed.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An image sensing apparatus comprising:
    a first substrate structure including a pixel that includes a photodiode disposed in the first substrate structure;
    a second substrate structure including a circuit configured to drive the pixel, and having a first surface and a second surface;
    a chip structure including a memory chip and a dummy chip;
    a first wiring structure disposed in the first substrate structure, and configured to be electrically connected to the photodiode;
    a second wiring structure disposed in the second substrate structure;
    a first connection via passing through the first substrate structure, and configured to be electrically connected to the first wiring structure, the first connection via being configured to electrically connect the first substrate structure and the second substrate structure;
    a second connection via passing through the first substrate structure; and
    a third connection via passing through the second substrate structure, and configured to be electrically connected to the second wiring structure, the third connection via being configured to electrically connect the second substrate structure and the chip structure,
    wherein the first substrate structure is disposed on the first surface of the second substrate structure,
    the second substrate structure is disposed on the chip structure,
    the second connection via is not electrically connected to the first wiring structure,
    a width of a widest portion of the first connection via is less than a width of a widest portion of the third connection via, and
    a height of the first connection via is less than a height of the third connection via.

2. The image sensing apparatus of claim 1, wherein none of the first connection via and the second connection via in the first substrate structure is disposed directly above the third connection via.

3. The image sensing apparatus of claim 1, wherein a shape of the first connection via is different from a shape of the second connection via.

4. The image sensing apparatus of claim 1, wherein a shape of the first connection via is different from a shape of the third connection via.

5. The image sensing apparatus of claim 1, wherein the memory chip is electrically connected to the third connection via.

6. The image sensing apparatus of claim 1, wherein none of the first connection via, the second connection via, and the third connection via is electrically connected to the dummy chip.

7. The image sensing apparatus of claim 1, wherein the pixel further includes:
    a color filter disposed on the photodiode; and
    a micro-lens disposed on the color filter.

8. The image sensing apparatus of claim 1, wherein the first substrate structure includes a first substrate and a first insulating layer disposed between the first substrate and the second substrate structure, and the second substrate structure includes a second substrate and a second insulating layer disposed between the second substrate and the first insulating layer.

9. The image sensing apparatus of claim 8, wherein the first wiring structure includes:
a plurality of first wiring layers disposed in the first insulating layer, and electrically connected to the first connection via; and
a plurality of first vias electrically connected to at least one of the photodiode and the plurality of first wiring layers, and
wherein the second wiring structure includes:
a plurality of second wiring layers disposed in the second insulating layer, and electrically connected to the first connection via and the third connection via; and
a plurality of second vias electrically connected to the plurality of second wiring layers.

10. The image sensing apparatus of claim 1, wherein the memory chip is electrically connected to the third connection via through:
a first pad disposed on the memory chip;
a bump disposed on the first pad;
a second pad disposed on the bump; and
a redistribution layer disposed on the second pad, and disposed beneath the second surface of the second substrate structure.

11. An image sensing apparatus comprising:
a ramp signal generator configured to generate a ramp signal;
a pixel array configured to sense an image and to generate an analog signal, the pixel array including a plurality of pixels;
a row driver configured to selectively activate rows of the pixel array;
a correlated double sampler (CDS) configured to receive the ramp signal and the analog signal, and to sample the analog signal;
an analog-to-digital converter (ADC) configured to convert the sampled analog signal to a digital image data;
a memory configured to receive the digital image data, and to store the digital image data;
a first substrate structure including the plurality of pixels, each of the plurality of pixels including a photodiode;
a second substrate structure including the ramp signal generator, the row driver, the CDS and the ADC, and having a first surface and a second surface;
a third structure including the memory;
a first wiring structure disposed in the first substrate structure, and configured to be electrically connected to the photodiode;
a second wiring structure disposed in the second substrate structure;
a first connection via passing through the first substrate structure, and configured to be electrically connected to the first wiring structure, the first connection via being configured to electrically connect the first substrate structure and the second substrate structure;
a second connection via passing through the first substrate structure; and
a third connection via passing through the second substrate structure, and configured to be electrically connected to the second wiring structure, the third connection via being configured to electrically connect the second substrate structure and the third substrate structure,
wherein the first substrate structure is disposed on the first surface of the second substrate structure, the second substrate structure is disposed on the third structure,
the second connection via is not electrically connected to the first wiring structure,
a width of a widest portion of the first connection via is less than a width of a widest portion of the third connection via,
a height of the first connection via is less than a height of the third connection via, and
each of the plurality of pixels includes a color filter disposed on the photodiode, and a micro-lens disposed on the color filter.

12. The image sensing apparatus of claim 11, wherein a shape of the first connection via is different from a shape of the second connection via, and
the shape of the first connection via is different from a shape of the third connection via.

13. The image sensing apparatus of claim 11, wherein the memory is electrically connected to the third connection via.

14. The image sensing apparatus of claim 11, wherein the first substrate structure includes a first substrate and a first insulating layer disposed between the first substrate and the second substrate structure,
the second substrate structure includes a second substrate and a second insulating layer disposed between the second substrate and the first insulating layer,
wherein the first wiring structure includes:
a plurality of first wiring layers disposed in the first insulating layer, and electrically connected to the first connection via; and
a plurality of first vias electrically connected to at least one of the photodiode and the plurality of first wiring layers, and
wherein the second wiring structure includes:
a plurality of second wiring layers disposed in the second insulating layer, and electrically connected to the first connection via and the third connection via; and
a plurality of second vias electrically connected to the plurality of second wiring layers.

15. The image sensing apparatus of claim 11, further comprising a chip disposed in the third structure,
wherein the chip is not a memory chip.

16. An image sensor comprising:
a ramp signal generator configured to generate a ramp signal;
a pixel array configured to sense an image and to generate an analog signal, the pixel array including a plurality of pixels;
a row driver configured to selectively activate rows of the pixel array;
a correlated double sampler (CDS) configured to receive the ramp signal and the analog signal, and to sample the analog signal;
an analog-to-digital converter (ADC) configured to convert the sampled analog signal to a digital image data;
a first substrate structure including the plurality of pixels, each of the plurality of pixels including a photodiode;
a second substrate structure including the ramp signal generator, the row driver, the CDS and the ADC, and having a first surface and a second surface;
a first wiring structure disposed in the first substrate structure, and configured to be electrically connected to the photodiode;
a second wiring structure disposed in the second substrate structure;

a first connection via passing through the first substrate structure, and configured to be electrically connected to the first wiring structure and the second wiring structure;

a second connection via passing through the first substrate structure; and a third connection via passing through the second substrate structure, and configured to be electrically connected to the second wiring structure, wherein the first substrate structure is disposed on the first surface of the second substrate structure, the second connection via is not electrically connected to the first wiring structure, a width of a widest portion of the first connection via is less than a width of a widest portion of the third connection via, a height of the first connection via is less than a height of the third connection via, and each of the plurality of pixels includes a color filter disposed on the photodiode, and a micro-lens disposed on the color filter.

17. The image sensor of claim 16, wherein the first substrate structure includes a first substrate and a first insulating layer disposed between the first substrate and the second substrate structure, and the second substrate structure includes a second substrate and a second insulating layer disposed between the second substrate and the first insulating layer.

18. The image sensor of claim 17, wherein the first wiring structure includes:

a plurality of first wiring layers disposed in the first insulating layer, and electrically connected to the first connection via; and a plurality of first vias electrically connected to at least one of the photodiode and the plurality of first wiring layers, and wherein the second wiring structure includes:

a plurality of second wiring layers disposed in the second insulating layer, and electrically connected to the first connection via and the third connection via; and a plurality of second vias electrically connected to the plurality of second wiring layers.

19. The image sensor of claim 16, further comprising a fourth connection via passing through the second substrate structure, and configured to be electrically connected to the second connection via.

20. The image sensor of claim 16, wherein a shape of the first connection via is different from a shape of the second connection via, and the shape of the first connection via is different from a shape of the third connection via.

* * * * *